(12) United States Patent
Yu et al.

(10) Patent No.: US 11,839,057 B2
(45) Date of Patent: Dec. 5, 2023

(54) APPARATUS WITH HOUSING HAVING STRUCTURE FOR RADIATING HEAT

(71) Applicant: Samsung Electronics Co., Ltd., Gyeonggi-do (KR)

(72) Inventors: Sangsoo Yu, Gyeonggi-do (KR); Sehoon Kim, Gyeonggi-do (KR); Jeongmin Park, Gyeonggi-do (KR)

(73) Assignee: Samsung Electronics Co., Ltd

( * ) Notice: Subject to any disclaimer, the term of this patent is extended or adjusted under 35 U.S.C. 154(b) by 203 days.

(21) Appl. No.: 16/923,452

(22) Filed: Jul. 8, 2020

(65) Prior Publication Data

US 2021/0015005 A1    Jan. 14, 2021

(30) Foreign Application Priority Data

Jul. 12, 2019 (KR) .................. 10-2019-0084262
May 7, 2020 (KR) .................. 10-2020-0054411

(51) Int. Cl.
*H05K 7/20* (2006.01)
*H05K 5/02* (2006.01)
*F25D 23/00* (2006.01)
*H05K 5/03* (2006.01)

(52) U.S. Cl.
CPC ....... *H05K 7/20409* (2013.01); *F25D 23/006* (2013.01); *H05K 5/0217* (2013.01); *H05K 7/20218* (2013.01); *H05K 5/03* (2013.01)

(58) Field of Classification Search
CPC ............ H05K 7/20409; H05K 5/0217; H05K 7/20218; H05K 5/03; H05K 7/20309; H05K 7/2029; F25D 23/006
See application file for complete search history.

(56) References Cited

U.S. PATENT DOCUMENTS 7,304,842 B2   12/2007   Yatskov
9,639,127 B2    5/2017   Kim
(Continued)

FOREIGN PATENT DOCUMENTS

| CN | 1980558 | 6/2007 |
|----|---------|--------|
| CN | 101052290 | 10/2007 |
| CN | 201039650 | 3/2008 |
| CN | 102130080 | 7/2011 |

(Continued)

OTHER PUBLICATIONS

Chinese Office Action dated Sep. 1, 2021 issued in counterpart application No. 202010663655.2, 20 pages.

(Continued)

*Primary Examiner* — Elizabeth J Martin
*Assistant Examiner* — Dario Antonio Deleon
(74) *Attorney, Agent, or Firm* — The Farrell Law Firm, P.C.

(57) ABSTRACT

An apparatus with a housing having a structure for heat dissipation is provided. The apparatus includes the housing having at least one surface, outer walls, and a plurality of fins, and an operating unit fixed to the housing, wherein the at least one surface of the housing includes a fin cover connected to the fins, a base exposed in an internal space in which the operating unit is disposed, and a refrigerant filled in a space between the fin cover and the base, wherein the fin cover and the base are connected through the outer walls, and wherein the fin cover has a flat surface.

19 Claims, 32 Drawing Sheets

(56) References Cited

U.S. PATENT DOCUMENTS

| | | | |
|---|---|---|---|
| 2007/0246193 A1* | 10/2007 | Bhatti et al. | H05K 7/20 165/104.21 |
| 2008/0110599 A1* | 5/2008 | Reyzin et al. | H05K 7/20 165/104.33 |
| 2008/0112134 A1* | 5/2008 | Rubenstein | H01L 23/467 361/695 |
| 2010/0258278 A1 | 10/2010 | Moon et al. | |
| 2011/0067841 A1* | 3/2011 | Doo et al. | F28D 15/00 165/104.19 |
| 2015/0144319 A1* | 5/2015 | Natali | H05K 7/20409 |
| 2015/0146380 A1* | 5/2015 | Lu et al. | H05K 7/20 |
| 2016/0093788 A1* | 3/2016 | Matsumoto et al. | H01L 35/32 |
| 2017/0077587 A1* | 3/2017 | Fleancu et al. | H01Q 1/20 |
| 2017/0094832 A1* | 3/2017 | Pitwon et al. | H05K 7/20 |
| 2018/0006441 A1* | 1/2018 | Sumida | H02G 3/16 |
| 2018/0192545 A1* | 7/2018 | Chen et al. | H05K 7/20336 |
| 2019/0141854 A1* | 5/2019 | Ku et al. | H05K 7/20336 |
| 2019/0174659 A1* | 6/2019 | Lin et al. | H05K 9/00 |
| 2020/0161215 A1* | 5/2020 | McNamara et al. | H05K 7/20409 |

FOREIGN PATENT DOCUMENTS

| | | |
|---|---|---|
| CN | 202750388 | 2/2013 |
| CN | 104114010 | 10/2020 |
| JP | 10-209356 | 8/1998 |
| JP | 2002-232175 | 8/2002 |
| JP | 2004207661 | 7/2004 |
| JP | 3213632 | 11/2017 |
| JP | 6413306 | 10/2018 |

OTHER PUBLICATIONS

Chinese Office Action dated Jun. 2, 2022 issued in counterpart application No. 202010663655.2, 16 pages.

* cited by examiner

APPARATUS WITH HOUSING HAVING STRUCTURE FOR RADIATING HEAT

CROSS-REFERENCE TO RELATED APPLICATIONS

This application is based on and claims priority under 35 U.S.C. § 119 to Korean Patent Application Nos. 10-2019-0084262 and 10-2020-0054411, filed on Jul. 12, 2019 and May 7, 2020, respectively, in the Korean Intellectual Property Office, the contents of each of which are incorporated herein by reference in their entireties.

BACKGROUND

1. Field

The disclosure relates generally to an apparatus including a housing and, more particularly, to an apparatus with a housing having a structure for dissipating heat.

2. Description of Related Art

A housing is an outer part retaining internal parts in various apparatuses such as an electronic device and a mechanical apparatus. A housing is used to protect and fix components of an apparatus. Electronic devices that use power such as network equipment and mechanical apparatuses that physically operate may generate heat during operation. Since heat may adversely influence the operation of apparatuses, housings are usually designed to have a structure that dissipates heat to the outside.

Recently, as circuits are highly integrated and equipment is reduced in size with development of the electronic industry, electronic function groups are more densely installed on a printed board assembly (PBA). As electronic devices are manufactured in small sizes, it becomes important to densely manufacture and mount a package including the PBA, which is an important element. In terms of the computer, as the storage capacity increases, the chip sizes naturally increase, such as a large-size random access memory (RAM) and a flash memory. However, reduced sizing of such components is studied in packages in consideration of this condition.

When various electronic devices are driven, heat is generated by electronic parts on a PBA disposed in the electronic devices. When the heat generated by various electronic parts on the PBA is not discharged well to the outside, the functions of the electronic devices are deteriorated by the heat, which reduces the lifespan of the products. Accordingly, in order to maintain the optimal performance of the electronic parts mounted on the PBA, there is a need for a device that distributes and dissipates heat generated in a device in order to maintain an environment suitable for the use characteristics of the electronic parts.

Network communication apparatuses such as a radio unit (RU) and a remote radio head (RRH) are generally installed outdoors. The housing of such an apparatus may be made of a material that slowly corrodes even if it is exposed to an environment with high humidity and a severe temperature change or is scratched on the surface, such as a metal material having high anticorrosion. For example, a housing may be made of an aluminum material since aluminum has high anticorrosion and low specific gravity in comparison to other metals.

Various approaches have been considered to decrease the weight of the housing for communication equipment. Such approaches include replacing aluminum, which is a light metal, with magnesium having a lower specific gravity and reducing weight by using a thinner aluminum. Other approaches may be applied, such as replacing aluminum with a material having high heat conductivity or attaching a specific part having high heat conductivity (e.g., a graphite sheet, a vapor chamber, or a heat pipe) to the surface of an aluminum material so that heat can more quickly spread.

When an aluminum material having a high heat conductivity (e.g., about 190 W/K (watts/Kelvin)) is used, it is possible to reduce the weight by decreasing the volume. However, forming the material is difficult due to the various characteristics of the material. Improvement of the heat dissipation effect is anticipated by attaching a high-heat conductive heat pipe or vapor chamber to the inner side of an aluminum housing. However, such parts can only be attached to flat surfaces that have a large area. Since most specific parts are made of a high-heat conductive copper material, the weight of the housing may be increased.

As such, there is a need in the art for a device that more efficiently distributes and dissipates heat, in a manner that conforms to the size requirements of modern day electronic devices.

SUMMARY

Aspects of the disclosure address at least the above-mentioned problems and/or disadvantages and provide at least the advantages described below. Accordingly, an aspect of the disclosure is to provide an apparatus including a housing having a light weight structure that can effectively dissipate heat.

Another aspect of the disclosure is to provide an apparatus including a housing having a surface filled with a refrigerant.

Another aspect of the disclosure is to provide an apparatus including a housing having fins filled with a refrigerant.

In accordance with an aspect of the disclosure, an apparatus with a housing includes the housing having at least one surface, outer walls, and a plurality of fins, and an operating unit fixed to the housing, wherein the at least one surface of the housing includes a fin cover connected to the fins, a base exposed in an internal space in which the operating unit is disposed, and a refrigerant filled in a space between the fin cover and the base, wherein the fin cover and the base are connected through the outer walls, and wherein the fin cover has a flat surface.

In accordance with another aspect of the disclosure, a housing of an apparatus includes at least one surface, outer walls connected to the at least one surface, and a plurality of fins connected to the at least one surface, wherein the at least one surface of the housing includes a fin cover connected to the fins, a base exposed in an internal space in which an operating unit is disposed, and a refrigerant filled in a space between the fin cover and the base, wherein the fin cover and the base are connected through the outer walls, and wherein the fin cover has a flat surface.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
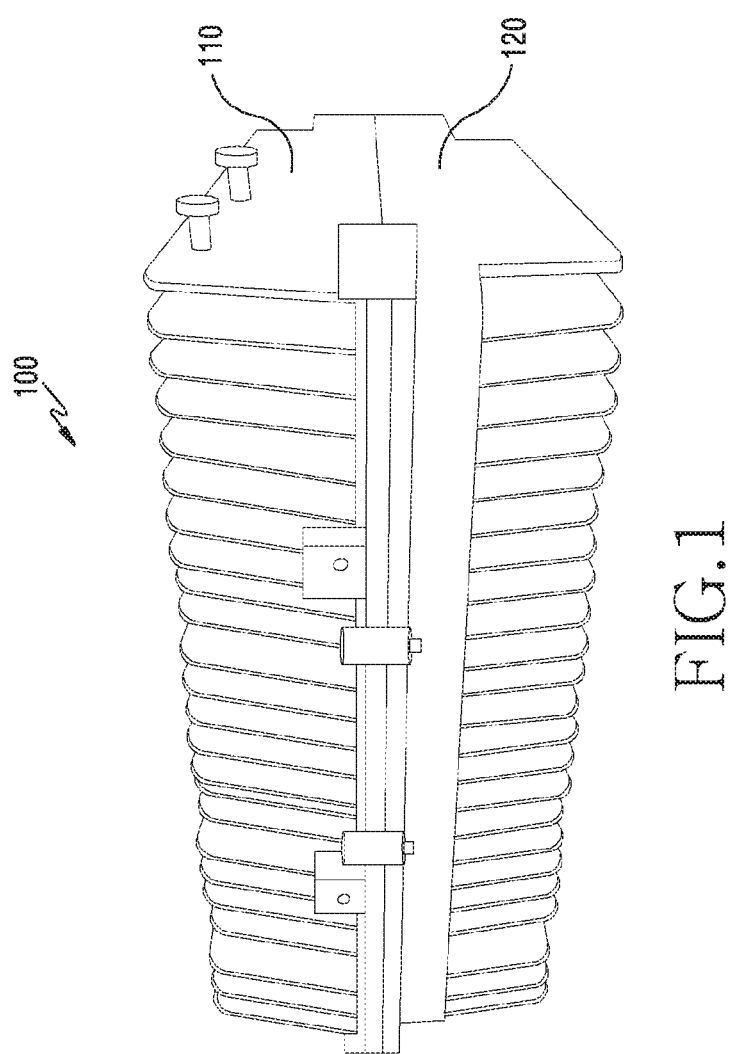
FIG. 1 illustrates an apparatus, according to an embodiment.

Embodiments will be described with reference to accompanying drawings. However, this is not intended to limit the technologies described in the disclosure to specific embodiments, and it should be understood to include various modifications, equivalents, and/or alternatives of the embodiments. Descriptions of well-known functions and/or configurations will be omitted for the sake of clarity and conciseness.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the same meanings as the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

In embodiments of the disclosure, an element is expressed in the singular or the plural form according to presented detailed embodiments. However, the singular form or plural form is selected appropriately to the presented situation for the convenience of description, and the disclosure is not limited by elements expressed in the singular or the plural form. Therefore, either an element expressed in the plural form may also include a single element or an element expressed in the singular form may also include multiple elements.

Hereinafter, embodiments will be described based on hardware, but include a technology that uses both hardware and software. Thus, the embodiments do not exclude software.

The disclosure relates to an apparatus with a housing having a structure for more effectively dissipating internal heat.

For example, terms designating structure, substances, shapes, and components of an apparatus in the following description are described for the convenience of description. Accordingly, the disclosure is not limited to the terms herein and other terms having equivalent meanings may be used.

In the disclosure, expressions such as "more than" and "less than" are used to determine whether specific conditions are satisfied, but are merely examples and do not exclude expressions such as "or more" or "or less". A condition described as "or more" may be replaced with "more than", a condition described as "or less" may be replaced with "less than", and conditions described as "or more and less than" may be replaced with "more than and or less".

A network communication apparatus is described herein as an example of an apparatus with a housing. However, the structure of a housing described herein may be applied to the housings of other apparatuses (e.g., a mechanical apparatus) in addition to a network communication apparatus.

The disclosure relates to a heat dissipation apparatus that is used for various items of communication equipment such as a mobile communication base station, a route (e.g., a high power amplifier (HPA) and a linear power amplifier (LPA)) in which various PBAs or amplifiers are disposed in a shelf or an outdoor housing. In particular, the disclosure relates to a heat dissipation apparatus for communication equipment, including heat dissipation fins filled with a refrigerant for efficiently discharging heat generated by a high heat-generation element or an amplifier mounted on the PBA, an upper fin cover connected with the heat dissipation fins, and a lower base connected with the upper fin cover.

FIG. 1 illustrates an apparatus, according to an embodiment.

Referring to FIG. 1, the apparatus 100 includes an upper housing 110 and a lower housing 120 which are assembled to form a closed space for protecting a PBA from the outside. The PBA is an assembly of circuits including a board on which is mounted a plurality of parts. A component that is disposed in the internal space formed by the upper housing 110 and the lower housing 120 such as a PBA generates heat when operating. For example, the operation may be a physical motion, signal processing by an electronic circuit, or data calculation. The component disposed in the internal space may be referred to as an operating unit.

The upper housing 110 and the lower housing 120 each may have a plurality of fins for heat dissipation. Alternatively, any one of the upper housing 110 and the lower housing 120 may not include a fin. The internal and external structures of the upper housing 110 are shown in FIGS. 2A and 2B.

Figure 2A:
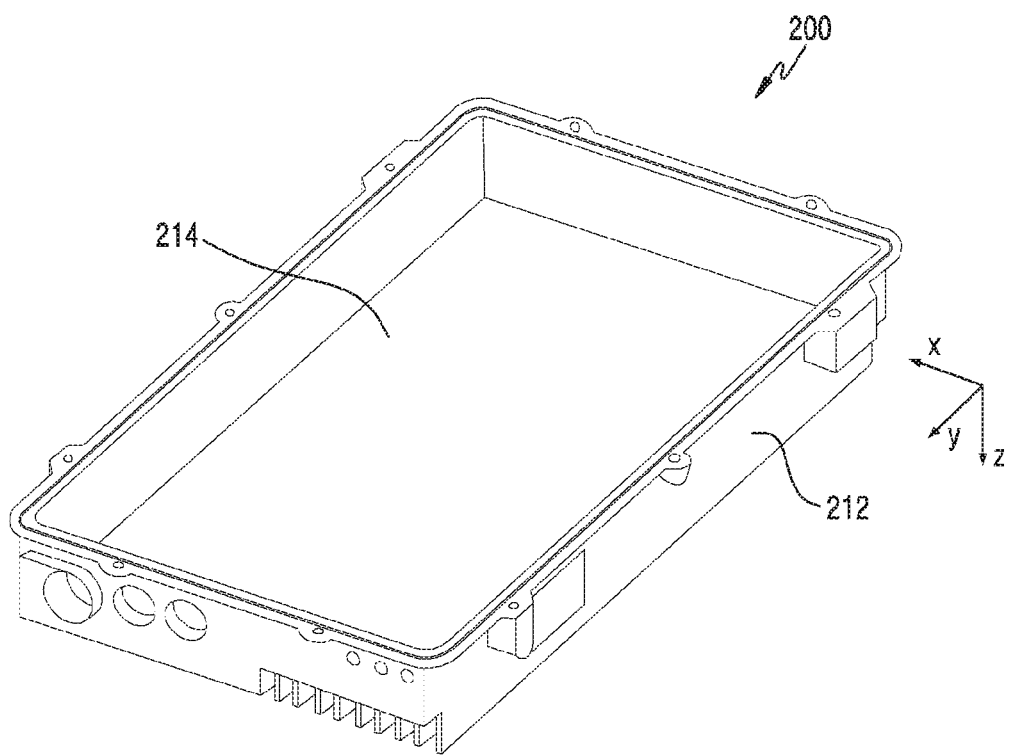
FIG. 2A illustrates a housing interior of an apparatus, according to an embodiment.

FIG. 2A illustrates a housing interior of a device, according to an embodiment. FIG. 2B illustrates a housing exterior of a device, according to an embodiment. The housing 200 shown in FIGS. 2A and 2B may be understood as the upper housing 110 or the lower housing 120 shown in FIG. 1.

Figure 2B:
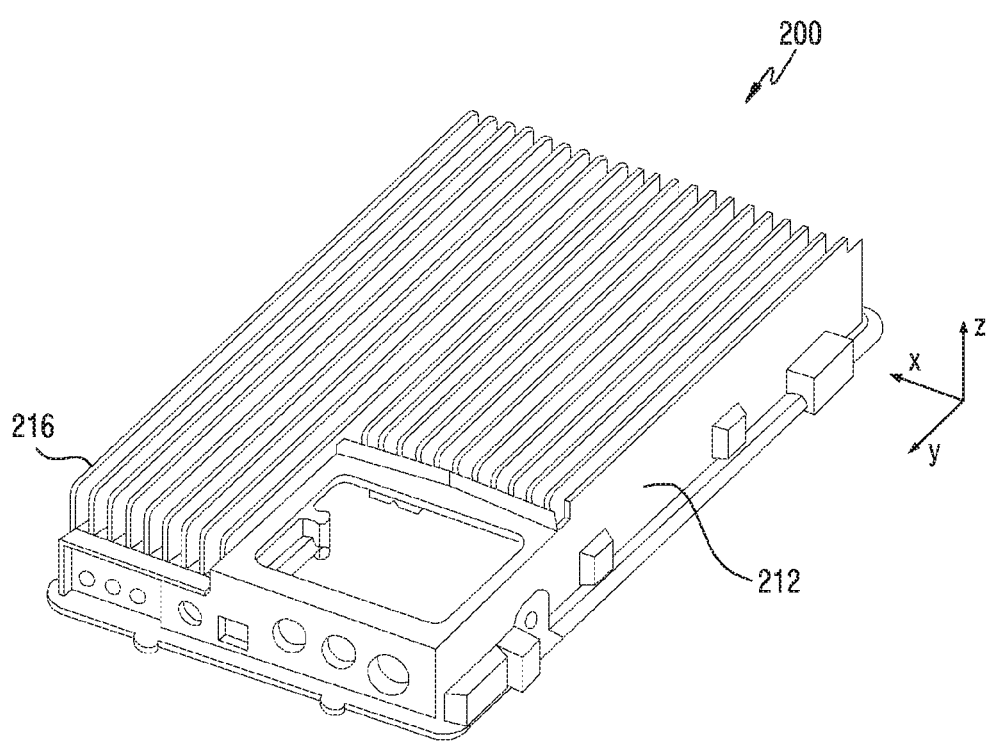
FIG. 2B illustrates a housing exterior of an apparatus, according to an embodiment.

Referring to FIGS. 2A and 2B, the housing 200 has a wall 212, a bottom 214, and a plurality of fins 216 formed on the outer side. In FIG. 2A, the bottom 214 may be formed in shapes having various heights, depending on the parts that are disposed in the housing 200. The fins 216 increase a surface area to discharge heat from the housing 200.

The housing 200 shown in FIGS. 2A and 2B may be made of an aluminum material having high heat conductivity and anticorrosion and may be manufactured by aluminum die casting. The bottom of a housing manufactured by aluminum die casting usually has a thickness of about 3 to 6 millimeters (mm) and may have a structure fully filled with an aluminum material. In order to mount a PBA with parts having different heights in the housing, the structure of the bottom may be formed in a complicated structure in accordance with height changes of the parts of the PBA. Accordingly, heat that is generated from the PBA transfers to the inner side of the housing, transfers to the fins through the bottom of the housing (with heat conductivity of about 90 to 180 W/mK), and is then discharged outside through the fins.

Figure 3:
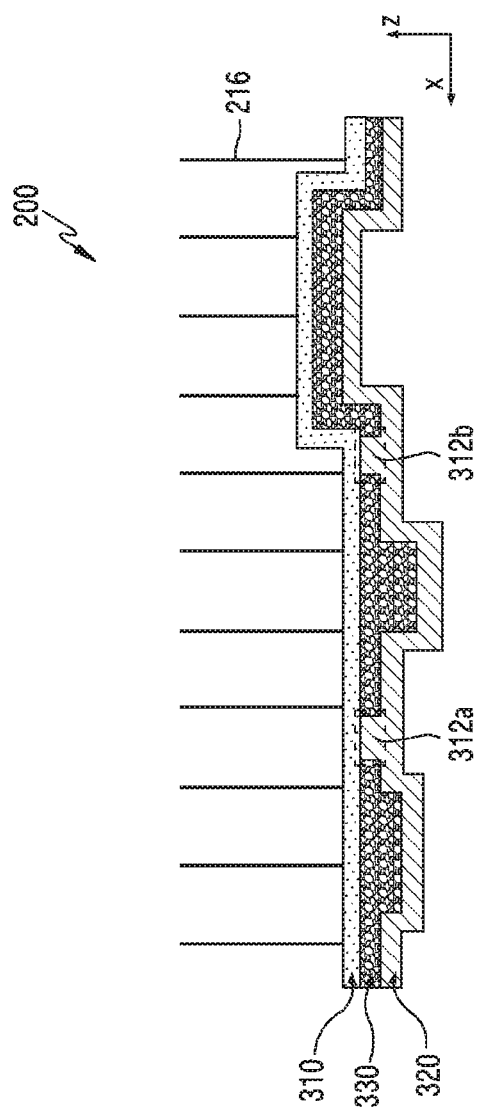
FIG. 3 illustrates a cross-section of the housing, according to an embodiment.

FIG. 3 illustrates a cross-section of the housing, according to an embodiment. FIG. 3 is a partial cross-section of the bottom of the housing 200.

Referring to FIG. 3, the bottom has a fin cover 310 connected with the fins 216, and a base 320 exposed inside. The fin cover 310 may be referred to as an upper cover, an upper plate, an upper layer, an upper layer portion, a fin layer, or other terms having the same technical meaning. The base 320 may be referred to as a lower cover, a lower plate, a lower layer, a base layer, a base, or other terms having the same technical meaning. The base 320 may have a structure of which the z-axial height changes in accordance with the parts included in the PBA disposed in the housing. The height of the structure of the base 320 is varied to effectively transmit heat by reducing the gaps from the parts included in the PBA. The base 320 may have a z-axial thickness of 1.0 mm or more.

A space 330 is defined between the fin cover 310 and the base 320. The space 330 is filled with a refrigerant, such as a working fluid having a high heat transfer characteristic. The refrigerant, which carries heat while changing the phase, may include a fluid substance or a wick. The fluid included in the refrigerant injected in the space between the fin cover 310 and the base 320 may be a common liquid-state substance such as water or acetone. Depending on the use temperature and required conditions of a product, various refrigerants that are used for common heat pipes and vapor chambers may be used. The z-axial thickness of the space 330 is related to the thermal performance of the refrigerant to be injected, and may be between 1.0 mm and 50 mm.

According to the structure shown in FIG. 3, heat generated from the PBA transfers to the base 320 disposed in the housing, the heat transferring inside transfers to the fin cover 310 by the high-heat conductive refrigerant adjacent to the bottom of the housing, and then the heat can be discharged through the fins 216. Heat conductivity of at least about 4,000 W/mK is realized by the refrigerant.

The fin cover 310 and the base 320 can be bonded or assembled in various manners, such as through friction only on necessary portions by friction stir welding (FSW). As another example, the fin cover 310 and the base 320 are aligned and then placed into a high-temperature high-pressure chamber, whereby bonding surfaces of the fin cover 310 and the base 320 can be attached by diffusion welding. As another example, the fin cover 310 and the base 320 may be bonded by brazing or may be bolted to each other.

Fasteners such as screws or hooks are used to fix the PBA to the housing 200. As shown in FIG. 3, when the space 330 is defined between the fin cover 310 and the base 320 and is filled with a refrigerant and the fin cover 310 and the base 320 are coupled by fasteners without a specific structure, leakage of the refrigerant may occur. Therefore, protrusion 312a and 312b for coupling are formed at the position where a fastener is disposed. The protrusions 312a and 312b can also increase the structural strength of the space 330.

The protrusions 312a and 312b have x-axial and y-axial widths larger than the diameter of a fastener and extend from the base 320. Alternatively, a protrusion for coupling a fastener may extend from the fin cover 310.

Figure 4:
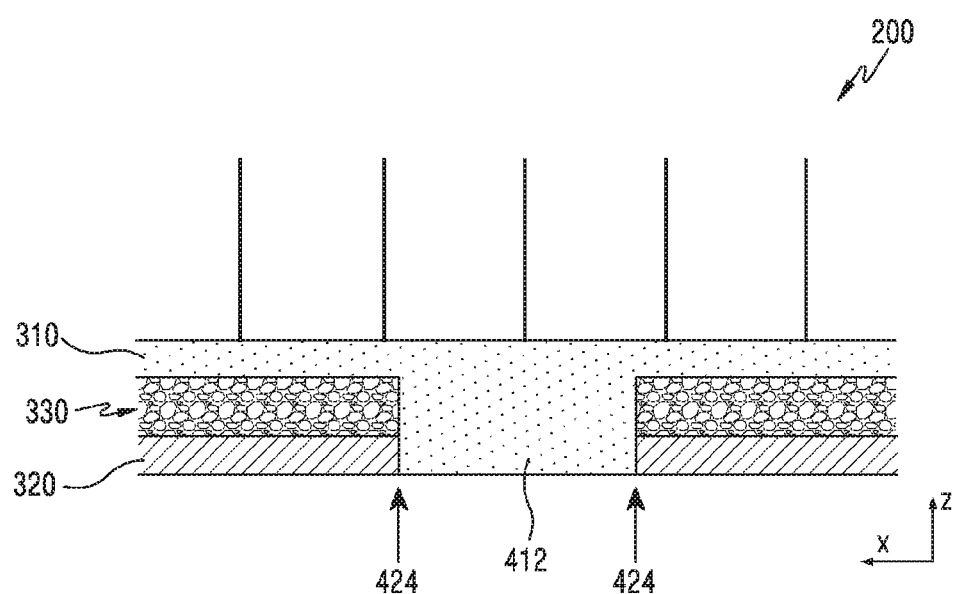
FIG. 4 illustrates the structure of a protrusion of the housing, according to an embodiment.

FIG. 4 illustrates the structure of a protrusion of the housing, according to an embodiment. Referring to FIG. 4, a hole is formed in the base 320 and a protrusion 412 that can be inserted into the hole extends from the fin cover 310. A gap 424 may be formed between the base 320 and the protrusion 412, but the gap 424 can be sealed by various methods (e.g., laser welding and friction welding). The protrusions 312a and 312b shown in FIG. 3 may have a z-axial length that is substantially the same as the thickness of the space 330 and the protrusion 412 shown in FIG. 4 may have a z-axial length larger than the thickness of the space 330.

According to the structure of the housing described above, high heat conductivity and an effect of reducing the volume and weight of the housing can be achieved.

According to the structure shown in FIG. 3, heat can be quickly conducted by the refrigerant. Since the refrigerant transmits heat throughout space between the fin cover and the base, heat at any one point can transfer to other points in the base. The heat transmitted by the refrigerant may transfer back to the PBA disposed inside, so it is required to protect the parts included in the PBA from the heat transferring through the housing. To this end, the disclosure describes a structure that relatively reduces heat spread by thermally isolating portions that generate a substantial amount of heat.

Figure 5A:
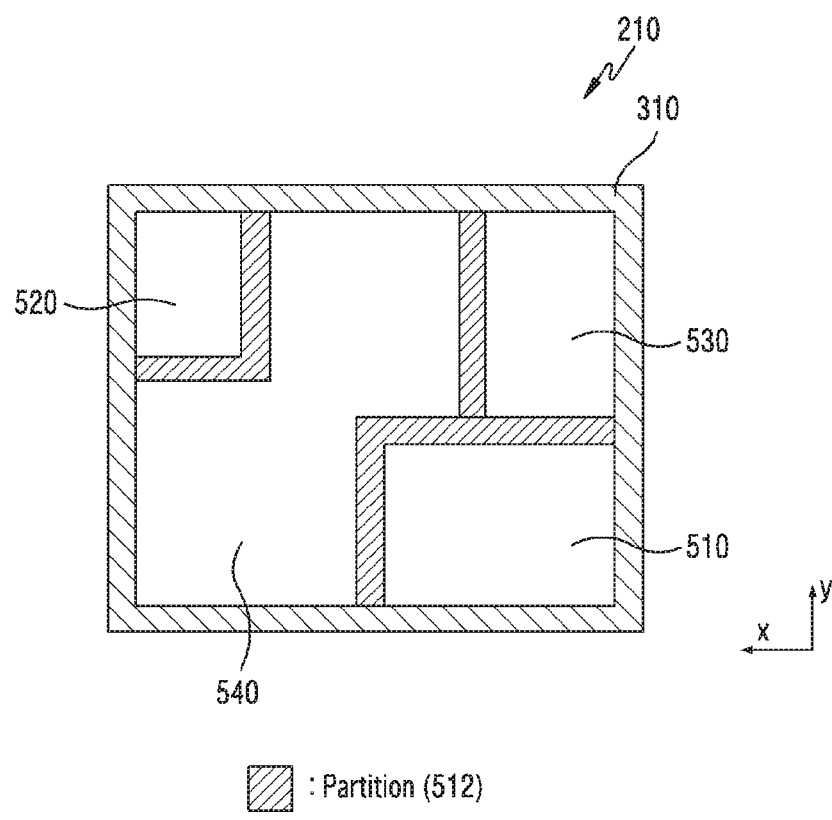
FIG. 5A illustrates a partition structure of a housing, according to an embodiment.

FIG. 5A illustrates a partition structure of a housing, according to an embodiment.

In particular, FIG. 5A illustrates the cross-section of the space 330 shown in FIG. 3. Referring to FIG. 5A, partitions 512 are formed in the space 330. The partitions 512 are damp-like structures and the space 330 is divided into four sections 510, 520, 530, and 540 by the partitions 512.

When there is no partition 512 and high-temperature heat is generated in the first section 510, the heat easily spreads to the second section 520, the third section 530, and the fourth section 540. However, when the partitions 512 are formed, as shown in FIG. 5A, the refrigerants in the four sections 510, 520, 530, and 540 are isolated, whereby transfer of heat generated in any one section to another section through the refrigerant can be prevented or reduced. For example, by forming a section around a part that generates a large amount of heat, other parts that show excellent performance when heat transfer is prevented can be protected. Specifically, by isolating parts that generate a large amount of heat, such as a field programmable gate array (FPGA), a central processing unit (CPU), and a system on chip (SOC), in one section, it is possible to protect a memory (e.g., a double data rate (DDR) memory) that is vulnerable to heat from heat transfer.

Figure 5B:
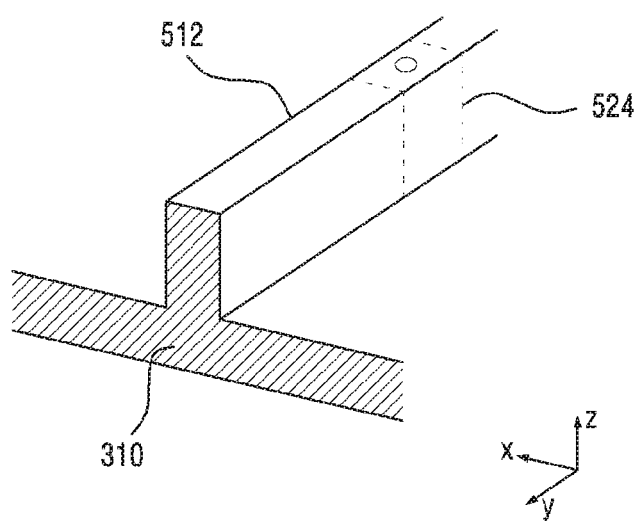
FIG. 5B illustrates the partition in the partition structure of the housing in FIG. 5A.

The partitions 512 may be formed in various manners, such as by extending a protrusion for coupling a fastener. FIG. 5B illustrates the partition in the partition structure of the housing in FIG. 5A. As shown in FIG. 5B, a partition 512 may be formed by extending a protrusion 524 in the x-y plane. In this case, the partition 512 may have the same z-axial length as the protrusion 524.

Figure 5C:
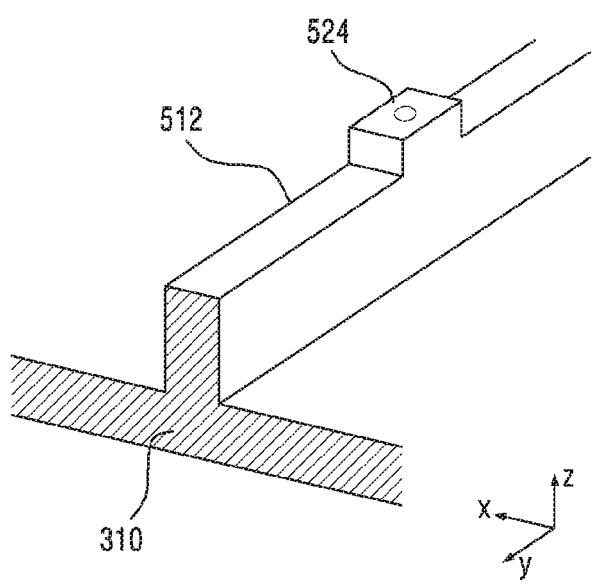
FIG. 5C illustrates the partition in the partition structure of the housing in FIG. 5A.

According to another embodiment, as shown in FIG. 5C, the partition 512 may have a smaller z-axial length than the protrusion 524. According to the case shown in FIG. 5C, the refrigerants in the sections are not completely isolated, so heat can transfer among the sections, but heat can more quickly go out of the section where the heat is generated. That is, the embodiment shown in FIG. 5C is more excellent in terms of heat dissipation of a part that generates heat.

As described above, it is possible to expect an increase of a heat dissipation effect by designing the bottom of the housing in a double-layer structure and filling the space between the layers with a refrigerant. This double-layer structure can be applied to not only a bottom connected with fins, but also a wall 212 of a housing. The structure filled with a refrigerant may be applied to a fin.

When a high-heat conductive refrigerant is injected into a fin, improvement in a heat dissipation effect and housing weight reduction are realized. In this case, heat conductivity of about 1,000 W/mK or more is realized, as compared with the heat conductivity of about 90~200 W/mK of a fin filled with aluminum. Since it is possible to freely and separately manufacture heat dissipation fins filled with a refrigerant without a limit in length or width regardless of a housing, it is possible to easily implement a product having long fins or a large number of fins, which was difficult in die casting. The longer the heat dissipation fin, the less weight is added, as compared with products manufactured by die casting.

A heat dissipation fin filled with a refrigerant is advantageous in terms of weight and heat dissipation performance. However, since a heat dissipation fin is manufactured separately from a housing and then attached, there is a possibility of thermal resistance by the attached surface.

Figure 6A:
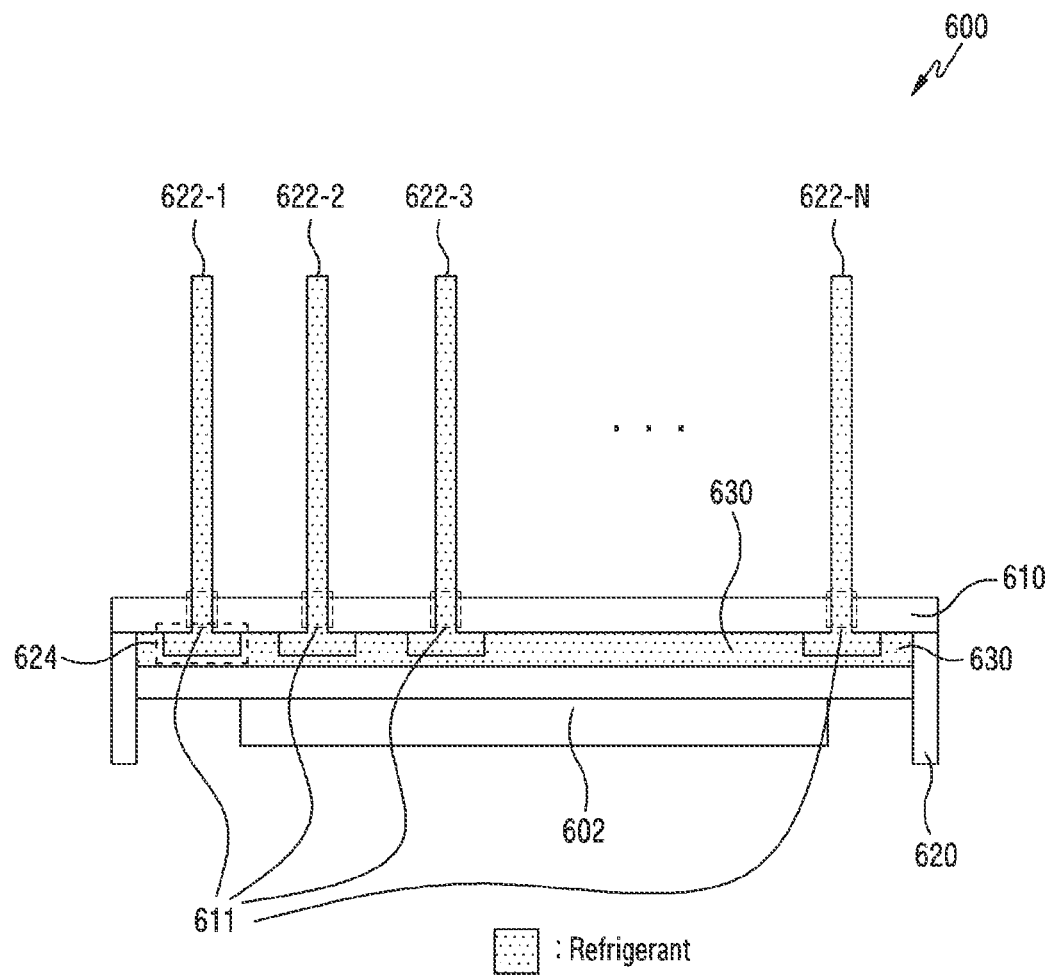
FIG. 6A illustrates a partial cross-section of the bottom of a housing, according to an embodiment.

FIG. 6A illustrates a partial cross-section of the bottom of a housing 600, according to an embodiment.

Referring to FIG. 6A, the bottom has a fin cover 610 connected with fins 622-1 to 622-N, and a base 320 exposed inside. The base 320 is shown flat in FIG. 6A, but may have a structure of which the z-axial height changes in accordance with the parts included in a PBA 602 disposed in the housing. A space 630 between the fin cover 610 and the base 620 is filled with a refrigerant.

The fins 622-1 to 622-N each have a space therein and may be made of an aluminum material. A plurality of through-slots is formed through the fin cover 610 to connect the fins 622-1 to 622-N to the fin cover 610. The fins 622-1 to 622-N are inserted into the through-slots and then the contact areas between the fins 622-1 to 622-N and the fin cover 610 are bonded, whereby the fins 622-1 to 622-N can be fixed to the fin cover 610.

Figure 6B:
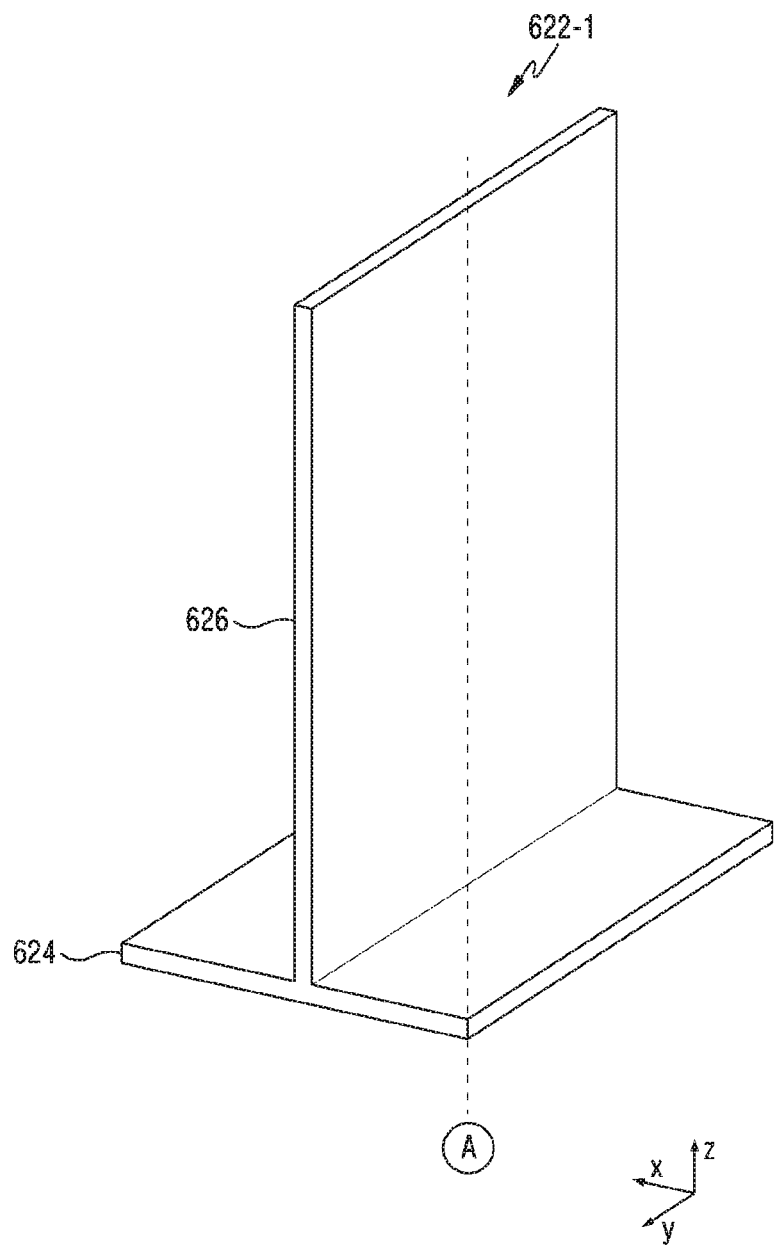
FIG. 6B illustrates fins of a housing, according to a first embodiment.
Figure 6C:
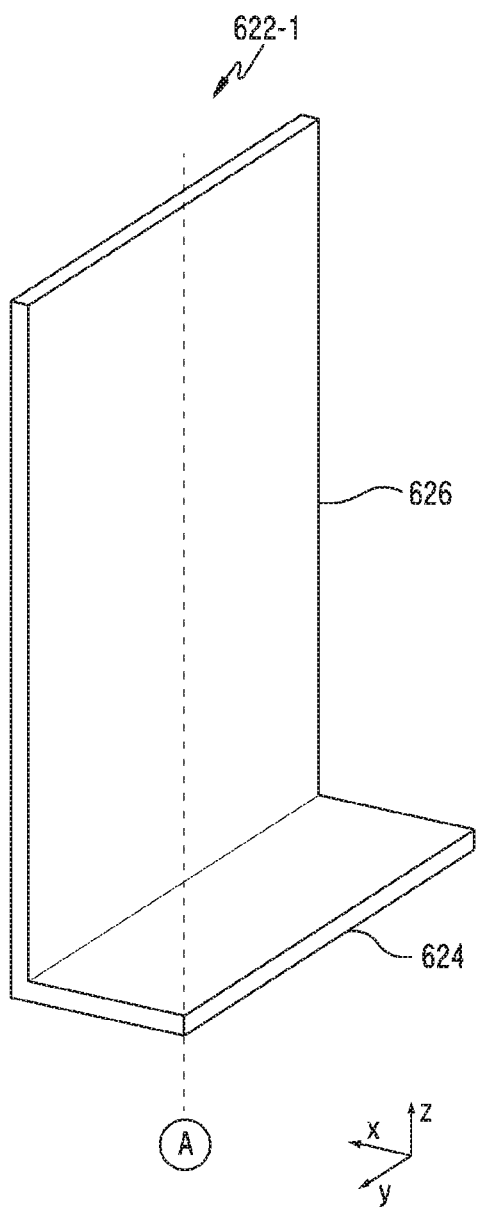
FIG. 6C illustrates fins of a housing, according to a second embodiment.
Figure 6D:
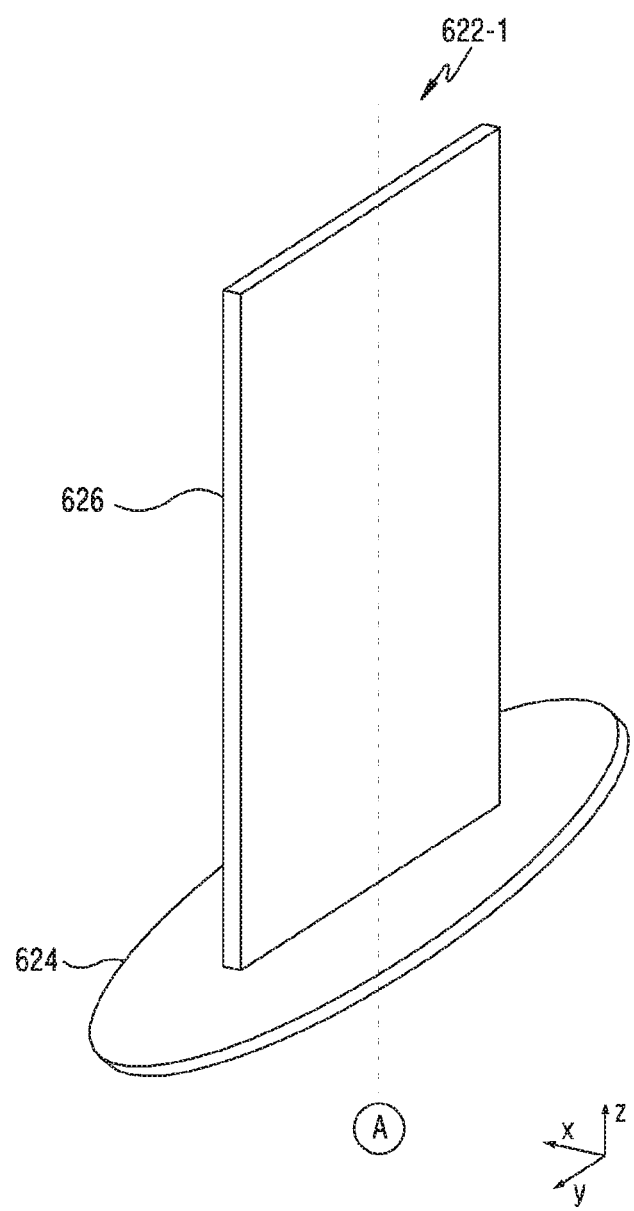
FIG. 6D illustrates fins of a housing, according to a third embodiment.

FIG. 6B illustrates fins of a housing, according to a first embodiment, FIG. 6C illustrates fins of a housing, according to a second embodiment, and FIG. 6D illustrates fins of a housing, according to a third embodiment.

In FIGS. 6B, 6C and 6D, in order to firmly fix the fins 622-1 to 622-N to the fin cover 610 and improve the heat conductivity from the refrigerant in the space 630, a contact portion 624 of each of the fins 622-1 to 622-N may be wider in at least any one direction than another portion 626. In other words, the contact portion 624 is wider than another portion 626 in at least one direction around an axis A in the x-y plane. The contact portion 624 may be formed in various shapes. For example, the contact portion 624 may be formed in an inverse T-shape, as shown in FIG. 6B, in an L-shape, as show in FIG. 6C, and in an elliptical shape, as shown in FIG. 6C.

The fins 622-1 to 622-N can be surface-bonded to the fin cover 610 by the contact portions 624. The fin cover 610 and the fins 622-1 to 622-N may be bonded by various techniques (e.g., brazing). The fin cover 610 bonded to the fins 622-1 to 622-N is bonded to the base 610, whereby the housing shown in FIG. 6A is formed.

Referring back to the structure shown in FIG. 6A, heat transfers sequentially through the housing, the high-heat conductive refrigerant, and the heat dissipation fins. Heat can transfer without a loss by the high heat conductivity of the refrigerant. The material and the bonding technique for manufacturing the housing having the structure shown in FIG. 6A are not limited. As described above, weight reduction and high heat conductivity are realized by using the heat dissipation fins filled with a refrigerant.

Figure 7:
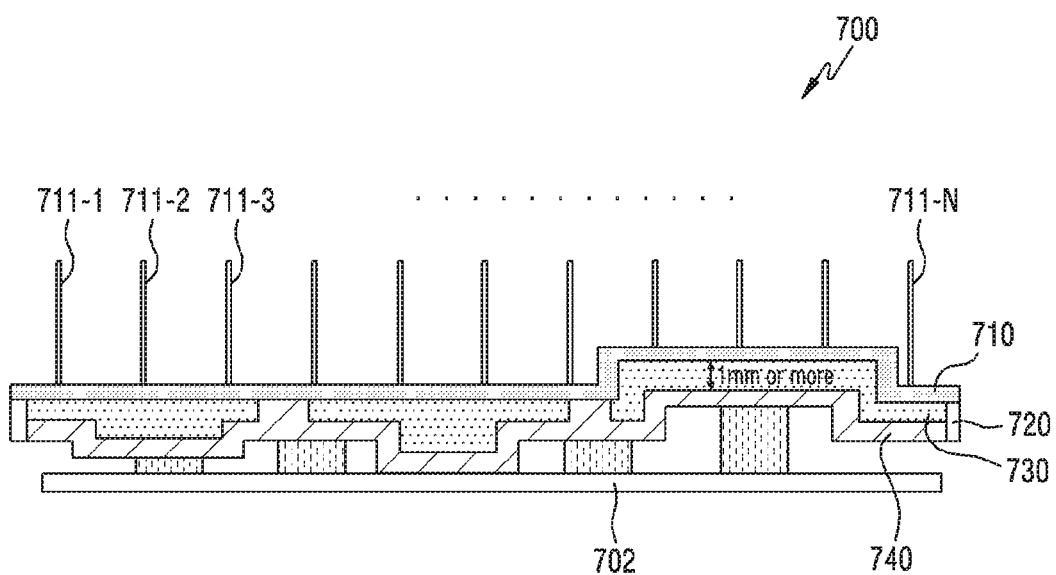
FIG. 7 illustrates a partial cross-section of the bottom of a housing, according to a first embodiment.

FIG. 7 illustrates a partial cross-section of the bottom of a housing, according to a first embodiment.

Referring to FIG. 7, the bottom has fins 711-1 to 711-N, a fin cover 710 (upper side) connected with the fins 711- to 711-N, and a base (lower side) 740 exposed inside. The fin cover 710 may be referred to as an upper cover, an upper plate, an upper layer, an upper layer portion, a fin layer, or other terms having the same technical meaning. The base 740 may be referred to as a lower cover, a lower plate, a lower layer, a base layer, or other terms having the same technical meaning. The base 740 may have a structure of which the z-axial height changes in accordance with the parts included in a PBA disposed in the housing. The height of the housing 700 may depend on the length of an outer wall 720, such that the gaps from the parts included in the PBA can be reduced and heat can effectively transfer. The base 740 may have a z-axial thickness of substantially 1.0 mm or more.

A space 730 is defined inside the fin cover 710, the base 740, and the outer wall 720. The space 730 is filled with a refrigerant, such as a working fluid having a high heat transfer characteristic. The refrigerant, which is a substance that carries heat while changing the phase, may include a fluid substance or a wick. The fluid included in the refrigerant injected in the space between the fin cover 710 and the base 740 may be a common liquid-state substance such as water or acetone. Depending on the use temperature and required conditions of a product, various refrigerants that are used for common heat pipes and vapor chambers may be used. The z-axial thickness of the space 730 is related to the thermal performance of the injected refrigerant and may be substantially between 1.0 mm and 50 mm.

As shown in FIG. 7, heat generated from the PBA 702 transfers to the base 740 disposed in the housing, the heat transferring inside transfers to the fin cover 710 by the high-heat conductive refrigerant adjacent to the bottom of the housing, and then the heat can be discharged through the fins 711-1 to 711-N. Heat conductivity of at least about 4,000 W/mK is realized by the refrigerant.

The fin cover 710 and the base 740 can be bonded or assembled in various manners in FIG. 7. For example, the fin cover 710 and the base 740 can be coupled through the outer wall 720, can be bonded through friction only on necessary portions by FSW, can be aligned and then placed into a high-temperature high-pressure chamber, whereby bonding surfaces of the fin cover 710 and the base 740 can be attached by diffusion welding, or can be bonded by brazing or bolted to each other.

Fasteners such as screws or hooks are used to fix the PBA 702 to the housing 700. As shown in FIG. 7, when the space 730 is defined between the fin cover 710 and the base 740 and is filled with a refrigerant and the fin cover 710 and the base 740 are coupled by fasteners without a specific structure, leakage of the refrigerant may occur. Therefore, a protrusion for coupling may be formed at the position where a fastener is disposed. The protrusion can also increase the structural strength of the space 730.

The base 740 shown in FIG. 7 should be designed such that the heat generated by the parts of the PBA 702 comes in direct contact with the surface of the base housing. Due to this design, the height is the housing changed by height differences of parts, which causes a complicated cross-sectional shape. For example, in the housing 700 shown in FIG. 7, the space 730 containing a refrigerant may have a thickness of substantially 1.0 mm or more from the base 740. In this case, stepped portions may be generated in the fin cover 710 by the height changes of the base 740. The fin cover 710 with stepped portions may be manufactured by die casting, but an expensive tool known as a mold is required and it is difficult to secure high flatness for bonding the fin cover 710 to the base 740. Since die-casting material is lower in heat conductivity than aluminum that is used in extrusion, there is a problem of deterioration of a heat dissipation characteristic.

Figure 8:
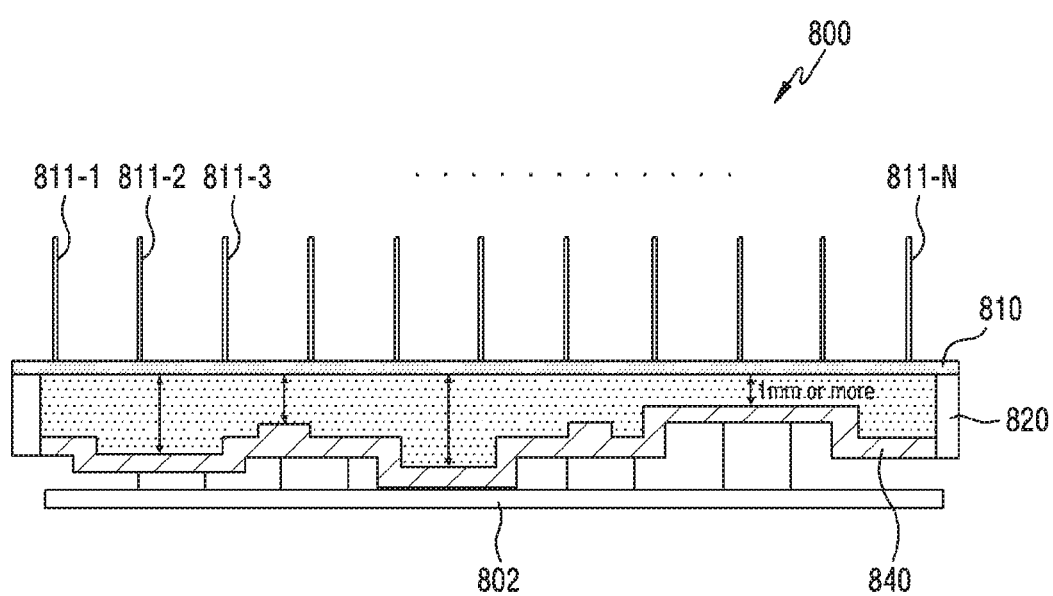
FIG. 8 illustrates a partial cross-section of the bottom of a housing, according to a second embodiment.

FIG. 8 illustrates a partial cross-section of the bottom of a housing, according to a second embodiment.

As shown in FIG. 8, the bottom has a fin cover 810 connected with fins 811-1 to 811-N, a base (lower side) 840 exposed inside, and an outer wall 820 connecting the fin cover 810 and the base 840. The fin cover 810 may be referred to as an upper cover, an upper plate, an upper layer, an upper layer portion, a fin layer, a fin cover, or other terms having the same technical meaning. The base 840 may be referred to as a lower cover, a lower plate, a lower layer, a base layer, or other terms having the same technical meaning. The outer wall 820 may be referred to as a side portion, a side plate, a side layer, or other terms having the same technical meaning. The outer wall 820 may be a side connecting the upper fin cover 810 and the lower base 840 with respect to the y-axis or the x-axis. The base 840 may have a structure of which the z-axial height changes in accordance with the parts included in a PBA 802 disposed in the housing 800. The fin cover 810 may have a flat surface.

A space 830 is defined inside the fin cover 810, the base 840, and the outer wall 820. The space 830 is filled with a refrigerant, such as a working fluid having a high heat transfer characteristic. The refrigerant, which is a substance that carries heat while changing phase, may include a fluid substance or a wick. The fluid included in the refrigerant injected in the space between the fin cover 810 and the base 840 may be a common liquid-state substance such as water or acetone. Depending on the use temperature and required conditions of a product, various refrigerants that are used for common heat pipes and vapor chambers may be used. The z-axial thickness of the space 830 is related to the thermal performance of the injected refrigerant and may be substantially between 1.0 mm and 50 mm.

As shown in FIG. 8, heat generated from the PBA 802 transfers to the base 840 disposed in the housing, the heat transferring inside transfers to the fin cover 810 by the high-heat conductive refrigerant adjacent to the bottom of the housing, and then the heat can be discharged through the fins 811-1 to 811-N. Heat conductivity of at least about 4,000 W/mK is realized by the refrigerant.

The fin cover 810 and the base 840 can be bonded or assembled in various manners in FIG. 8. For example, the fin cover 810 and the base 840 can be coupled through the outer wall 820, can be bonded through friction only on necessary portions by FSW, can be aligned and then put into a high-temperature high-pressure chamber, whereby bonding surfaces of the fin cover 810 and the base 840 can be attached by diffusion welding, or can be bonded by brazing or bolted to each other.

Fasteners such as screws or hooks are used to fix the PBA 802 to the housing 800. As shown in FIG. 8, when the space 830 is defined between the fin cover 810 and the base 840 and is filled with a refrigerant and the fin cover 810 and the base 840 are coupled by fasteners without a specific structure, leakage of the refrigerant may occur. Thus, a protrusion for coupling may be formed at the position where a fastener is coupled. The protrusion can also increase the structural strength of the space 830.

The fin cover 810 of the housing 800 may be designed to have different thicknesses in accordance with sections. The fin cover 810 may be designed not to have a uniform thickness regardless of sections, but to have different thicknesses, depending on the sections. In other words, unlike the fin cover 710 of the housing 700 having bends to correspond to the bends of the base 740 to have a uniform thickness, the housing 800 may have the flat fin cover 810. By designing the housing to have different thicknesses, depending on sections, the height of the cross-section of the fin cover 810 can be made uniform. Since the fin cover 810 has the uniform cross-sectional height, the thickness of the housing 800 may be different in accordance with the sections. Since the fin cover 810 has a flat structure, the fin cover 810 can be manufactured by extrusion and the fins may be manufactured at a low cost. Since the fin cover is manufactured by extrusion, an aluminum alloy having higher heat conductivity than die casting can be used. In the portions where the thickness increases, depending on the sections, a larger amount of refrigerant can be injected due to expansion of the space 830, thereby improving the heat dissipation effect.

Figure 9:
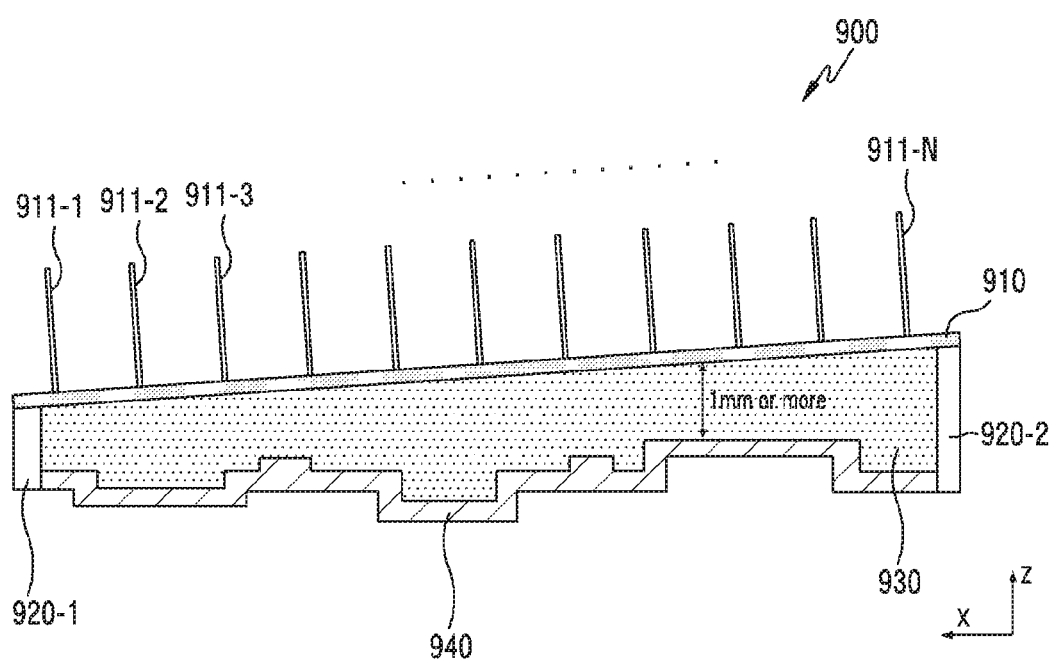
FIG. 9 illustrates a partial cross-section of the bottom of a housing, according to a third embodiment.

FIG. 9 illustrates a partial cross-section of the bottom of a housing, according to a third embodiment.

As shown in FIG. 9, the housing 900 has a fin cover (upper side) 910 connected with fins 911-1 to 911-N, a base (lower side) 940 exposed inside, and outer walls 920-1 and 920-2 connected with the fin cover 910 and the base 940. The fin cover 910 may be referred to as an upper cover, an upper plate, an upper layer, an upper layer portion, a fin layer, or other terms having the same technical meaning. The base 940 may be referred to as a lower cover, a lower plate, a lower layer, a base layer, or other terms having the same technical meaning. The outer walls 920-1 and 920-2 may be referred to as side portions, sides, side layers, side plates, or other terms having the same technical meaning.

The base 940 may have a structure of which the z-axial height changes in accordance with the parts included in a PBA disposed in the housing. The height of the housing 940 may depend on the length of the outer wall 920. The height of the structure of the base 940 is varied to effectively transmit heat by reducing the gaps from the parts included in the PBA. The base 940 may have a z-axial thickness of substantially 1.0 mm or more.

A space 930 is defined inside the fin cover 910, the base 940, and the outer wall 920 of the housing 900. The space 930 is filled with a refrigerant, such as a working fluid having a high heat transfer characteristic. The refrigerant, which is a substance that carries heat while changing the phase, may include a fluid substance or a wick. The fluid included in the refrigerant injected in the space between the fin cover 910 and the base 940 may be a common liquid-state substance such as water or acetone. Depending on the use temperature and required conditions of a product, various refrigerants that are used for common heat pipes and vapor chambers may be used. The z-axial thickness of the space 930 is related to the thermal performance of the injected refrigerant and may be substantially between 1.0 mm and 50 mm.

According to the structure shown in FIG. 9, heat generated from the PBA transfers to the base 940 disposed in the housing, the heat transferring inside transfers to the fin cover 910 by the high-heat conductive refrigerant adjacent to the bottom of the housing, and then the heat can be discharged through the fins 911-1 to 911-N. Heat conductivity of at least about 4,000 W/mK is realized by the refrigerant.

The fin cover 910 and the base 940 can be bonded or assembled in various manners in FIG. 9. For example, the fin cover 910 and the base 940 can be coupled through the outer wall 920, can be bonded through friction only on necessary portions by FSW, can be aligned and then are put into a high-temperature high-pressure chamber, whereby bonding surfaces of the fin cover 910 and the base 940 can be attached by diffusion welding, or can be bonded by brazing or bolted to each other.

Fasteners such as screws or hooks are used to fix the PBA to the housing 900. As shown in FIG. 9, when the space 930 is defined between the fin cover 910 and the base 940 and is filled with a refrigerant and the fin cover 910 and the base 940 are coupled by fasteners without a specific structure, leakage of the refrigerant may occur. Thus, a protrusion for coupling may be formed at the position where a fastener is coupled. The protrusion can also increase the structural strength of the space 930.

The housing 900 may have a flat surface, unlike the fin cover 710 of the housing 700 described above with reference to FIG. 7. The upper fin cover 901 of the housing 900 may be designed to have a space having a uniform thickness and to have different thicknesses, depending on sections, to correspond to the surface of the base 940. In other words, unlike the fin cover 710 of the housing 700 having bends to correspond to the bends of the base 740 to have a uniform thickness, the housing 900 has the flat fin cover 910. By designing the housing to have different thicknesses, depending on sections, the cross-section of the fin cover 910 can be made flat. Accordingly, the thickness of the housing 900 may depend on the sections.

In the housing 900 shown in FIG. 9, there are the outer walls 920-1 and 920-2 bonded to the base 940 and the fin cover 910 to contain a refrigerant and make the height of the fin cover 910 uniform. The housing 900 may have the outer walls 920-1 and 920-2 having different heights. As shown in FIG. 9, the outer wall 920-1 may have a height smaller than the outer wall 920-2. Accordingly, the fin cover 910 may have a structure inclined toward the outer wall 920-1 in the x-axial direction. The housing 900 can be designed to have various inclinations, depending on the height difference between the outer wall 920-1 and the outer wall 920-2. As another example, the housing 900 may be designed such that the height of the outer wall 920-1 is larger than the height of the outer wall 920-2. In this case, the fin cover 910 may have a structure inclined toward the outer wall 920-2 in the x-axial direction. Similar to the housing 900 shown in FIG. 9, it is possible to manufacture a housing with outer walls having different heights. In a housing with outer walls having different heights, the pin cover 910 may be inclined.

Figure 10:
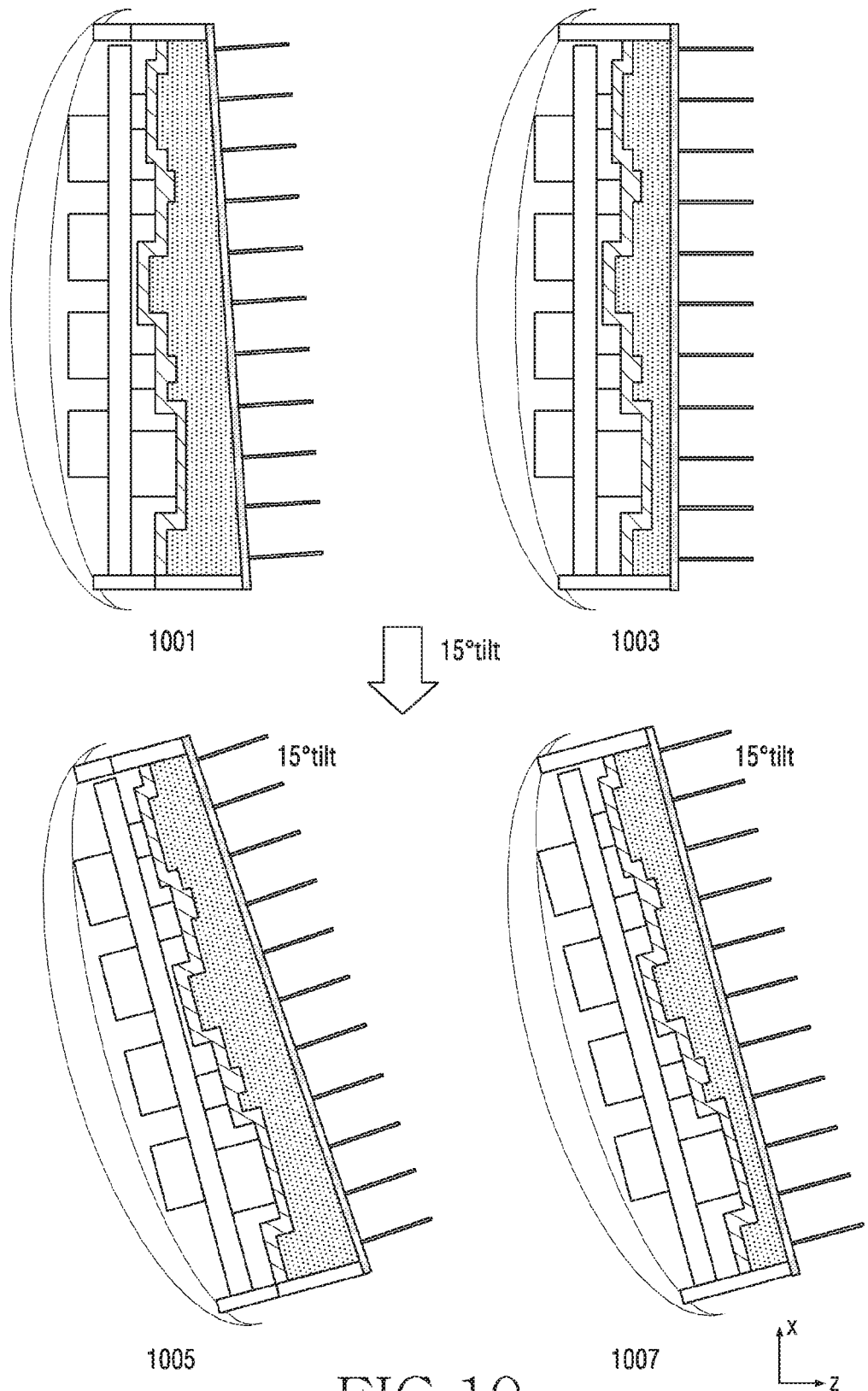
FIG. 10 illustrates a normal state and an installed state of a housing with outer walls having different heights, according to an embodiment.

FIG. 10 illustrates a normal state and an installed state of a housing with outer walls having different heights, according to an embodiment. A housing 1001 may include outer walls having different heights. A housing 1003 may include outer walls having the same height. A housing 1005 is the state in which the housing 1001 is installed at an angle of 15 degrees from the x-axis. A housing 1007 is the state in which the housing 1003 is installed at an angle of 15 degrees from the x-axis. Housings having different inclinations can be manufactured, depending on the height different between outer walls. Housings may be installed at various angles, depending on the environment in which a product is installed. When a housing has an inclination, the aspect of movement of the refrigerant in the space between the fin cover and the base of the housing may change, thereby altering the heat dissipation effect.

Although 15 degrees is the degree of inclination in FIG. 10, this is only an example for explaining the relationship between the inclined outer walls and the housing, and embodiments are not limited thereto.

Figure 11A:
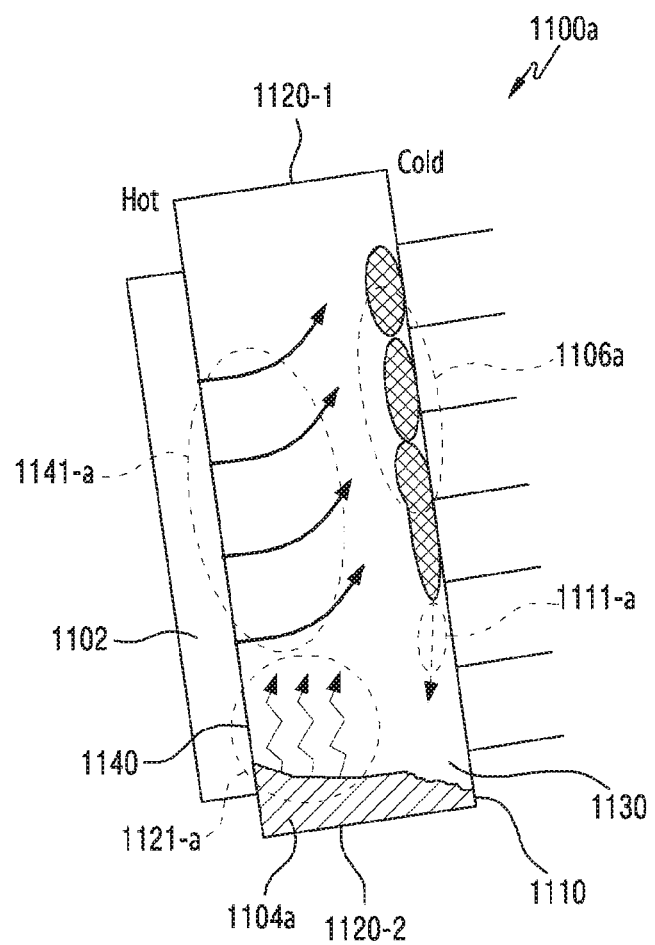
FIG. 11A illustrates movement of a refrigerant in a housing, according to a first embodiment.
Figure 11B:
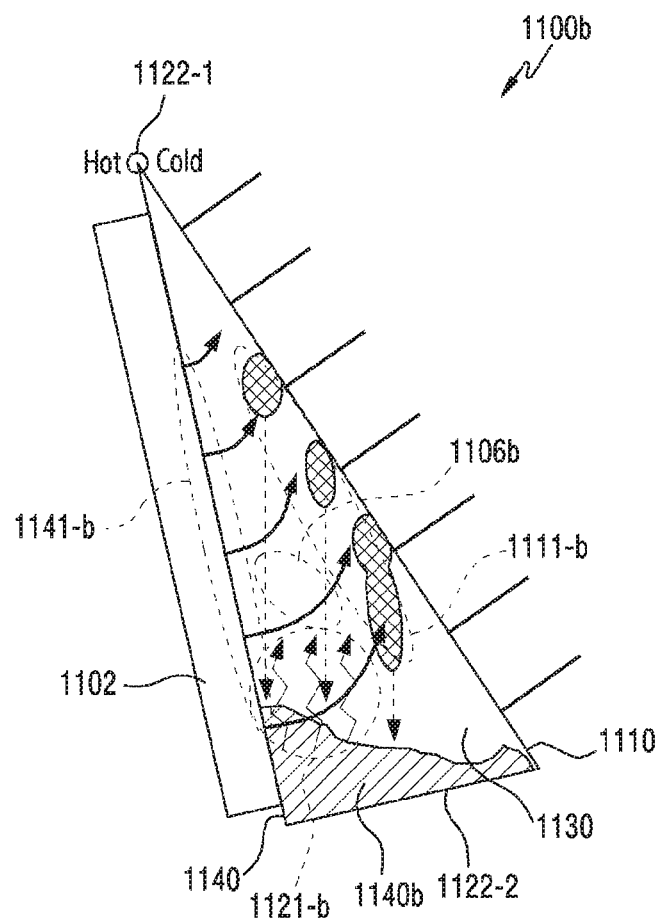
FIG. 11B illustrates movement of a refrigerant in a housing according to a second embodiment.
Figure 11C:
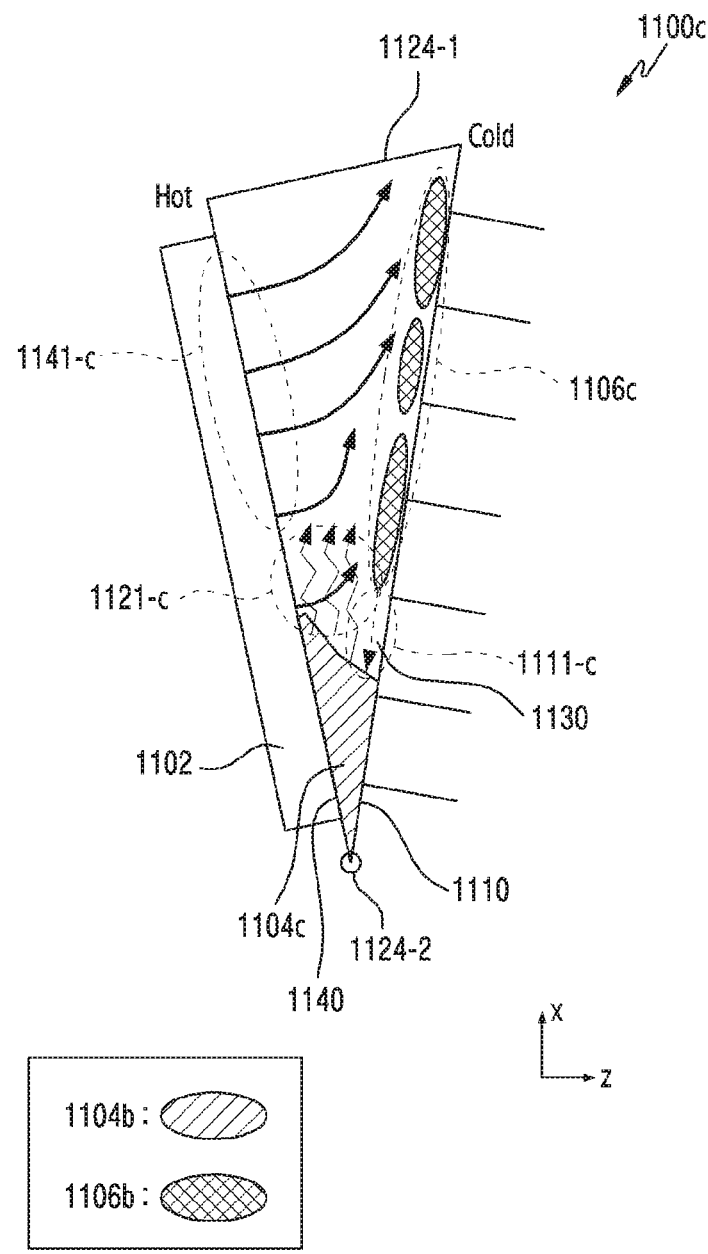
FIG. 11C illustrates movement of a refrigerant in a housing, according to a third embodiment.

FIG. 11A illustrates movement of a refrigerant in a housing, according to a first embodiment, FIG. 11B illustrates movement of a refrigerant in a housing, according to a second embodiment, and FIG. 11C illustrates movement of a refrigerant in a housing, according to a third embodiment. Housings 1100a, 1100b, and 1100c shown in FIGS. 11A, 11B 11C have a fin cover 1110, a base 1140, outer walls 1120-1, 1120-2, 1122-1, 1122-2, 1124-1, 1124-2, and an internal space 1130 defined by the fin cover 1110, the base 1140, and the outer walls 1120-1, 1120-2, 1122-1, 1122-2, 1124-1, 1124-2. A PBA 1102 may be bonded to the base 1140. Refrigerants 1104a, 1104b, 1104c, 1106a, 1106b, and 1106c for heat dissipation may be in the internal space 1130 of the housing. The outer walls 1120-1, 1122-1, and 1124-1 may be adjacent to the upper end of the housing apparatus. The outer walls 1120-2, 1122-2, and 1124-2 may be adjacent to the lower end of the housing apparatus.

Heat generated from the PBA 1102 disposed in the housing may transfer to the base 1140 disposed in the housing, and the heat transferring inside may transfer to the fin cover 1110 by a high-heat conductive refrigerant adjacent to the base 1140. Then, the heat can be discharged through the fins connected to the fin cover 1110. The base 1140 is directly connected to the PBA 1102, and thus may have a high temperature in comparison to the fin cover 1110.

The base 1140 may have different heat generation amounts for respective sections, depending on parts included in the PBA 1102 disposed in the housing. A base adjacent to a PBA generating a relatively large amount of heat may be at a relatively high temperature, and a base adjacent to a PBA generating a relatively small amount of heat may be at a relatively low temperature. As another example, the region of a base adjacent to a portion where relatively many parts generating heat are disposed may be at a relatively high temperature in comparison to the region of the base adjacent to a portion where few parts generating heat are disposed. As described above, there may be a high-temperature portion and a low-temperature portion, depending on the regions of the base, and the more the refrigerant circulates smoothly in a region where a large amount of heat is generated, the higher the heat dissipation effect may be. When the refrigerant in the space between the fin cover and the base of a housing is positioned closer to a heat generation source, the heat dissipation effect of the housing may be improved.

FIG. 11A illustrates a housing 1110a with outer walls having a uniform height. Referring to FIG. 11A, reference numeral 1141-a indicates heat generated from the base 1140 and spreading in the internal space of the housing. A refrigerant 1104a is positioned close to the outer wall 1120-2 due to the influence by gravity. Reference numeral 1121-a indicates the refrigerant 1104a receiving heat from the base 1140 and spreading in the internal space of the housing by vaporizing. Reference numeral 1111-a indicates a refrigerant 1106a spreading, dropping in temperature by coming in contact with the fin cover 1110 at a relatively low temperature, and then dropping to the lower end due to the influence by gravity.

In FIG. 11A, since there is not height difference between the outer walls 1120-1 and 1120-2 of the housing 1110a, the portion occupied by the refrigerant 1104a in the internal space 1130 may be relatively small. A heated refrigerant can drop to the lower end of the product by gravity, as indicated by reference numeral 1111-a. In this process, since there is no height difference between the outer walls 1120-1 and 1120-2, the inclination of the fin cover is relatively small, and accordingly, the refrigerant can drop on the surface of the fin cover 1110.

The housing 1100b shown in FIG. 11B is an example in which the outer wall 1122-1 adjacent to the upper end of a product has a greater height than that of the outer walls 1122-2 adjacent to the lower end of the product.

In FIG. 11B, reference numeral 1141-b indicates heat generated from the base 1140 of the housing 1110b and spreading in the internal space 1130 of the housing. A refrigerant 1104b is positioned close to the outer wall 1122-1 adjacent to the lower end of the housing due to the influence by gravity. The refrigerant 1104b, as compared with the refrigerant 1104a shown in FIG. 11A, comes in contact with the base 1140 in a relatively large area due to the inclination of the fin cover 1110. Reference numeral 1121-b indicates the refrigerant 1104b receiving heat from the base 1140 and spreading in the internal space 1130 of the housing by vaporizing. Reference numeral 1111-b indicates a refrigerant 1106b spreading, being cooled by coming in contact with the fin cover 1110 at a relatively low temperature, and then dropping due to the influence by gravity.

As shown in FIG. 11B, since there is a height difference between the outer walls 1120-1 and 1120-2 of the housing 1100b, the portion 1104b occupied by the refrigerant in the internal space 1130 of the housing is larger than the ratio occupied by the refrigerant 1104a in the housing 1100a shown in FIG. 11A. The refrigerant 1104b rises by receiving heat from the base 1140 and vaporizing, and is positioned at the upper end of the housing (1106b). The refrigerant 1106b can come in contact with the upper fin cover at a lower temperature than the base. The refrigerant decreases in temperature by coming in contact with the upper fin cover 1110 and the cooled refrigerant 1106b can drop in the housing by gravity, as indicated by reference numeral '1111-b'. Since the inclination of the fin cover is relatively large due to the height difference between the outer walls 1120-1 and 1120-2 of the housing 1100b, so the refrigerant can vertically drop in the gravity direction, but not drop on the fin cover. Since the cooled refrigerant 1106b is less influenced by the fin cover 1110 than the refrigerant 1106a shown in FIG. 11A, and vertically drops, the dropping speed may be relatively fast.

The refrigerant 1104b therein may be more efficiently positioned close to a heat generation source due to the inclination of the housing 1100b shown in FIG. 11B. Since the area of the upper end of the product is small, heat at a relatively high temperature can more quickly move to a cold portion. The housing 1100b having the fin cover with an inclination is highly influenced by gravity, and the refrigerant 1106b that has risen can vertically drop. The refrigerant 1106a that has risen can more quickly drop in the housing 1100b in comparison to the housing 1100a in which the refrigerant flows down on the surface of the fin cover, and accordingly, the circulation efficiency may be greater in housing 1100b than housing 1100a.

FIG. 11C illustrates the housing 1100c having an opposite height difference in a cross-section of the housing 1100b. In the housing 1100c shown in FIG. 11C, the length of the outer wall 1124-1 at the upper end of the product is larger than the length of the outer wall 1124-2 at the lower end of the product, so an inclination is formed toward the outer wall 1124-2.

As shown in FIG. 11C, reference numeral 1141-a indicates heat generated from the base 1140 of the housing 1110c and spreading in the internal space 1130 of the housing. A refrigerant 1104c may be positioned close to the outer wall 1124-2 at the lower end of the product due to the influence of gravity. The outer wall 1124-2 at the lower end of the housing 1100c may be designed to be shorter than the outer wall 1124-1 at the upper end. Reference numeral 1121-c indicates the refrigerant 1104c receiving heat from the base 1140 and spreading in the internal space 1130 of the housing by vaporizing. Reference numeral 1111-c indicates a refrigerant 1106c spreading from reference numeral 1121-c, decreasing in temperature by coming in contact with the fin cover 1110 at a lower temperature than the base 1140, and dropping due to the influence of gravity.

Comparing FIGS. 11A, 11B and 11C, since the area of the lower end of the housing decreases toward the outer wall, even if the same amount of refrigerant exists in the internal space 1130, the contact area of the refrigerant with the base 1140 of the housing is wide in comparison to the housing 1100a and the housing 1100b. By the design of the housing 1100c, the space in which a refrigerant collects at the lower end of the housing is minimized, so it is possible to achieve a structure that increases the height of the refrigerant and increases the space at the upper end of the housing.

In the structure of a mechanical housing that is filled with a refrigerant, the joint between the fin cover and the base of the housing should be sealed. A sealed refrigerant receives heat generated from the base, thereby being able to change the phase from liquid to gas. In the phase change process, a large vapor pressure may be generated. The fin cover and the base of the housing are separated by the vapor pressure, so there may be a danger of a refrigerant leaking. In relation to the danger, it is possible to increase the bonding area between the fin cover and the base of the housing.

Figure 12:
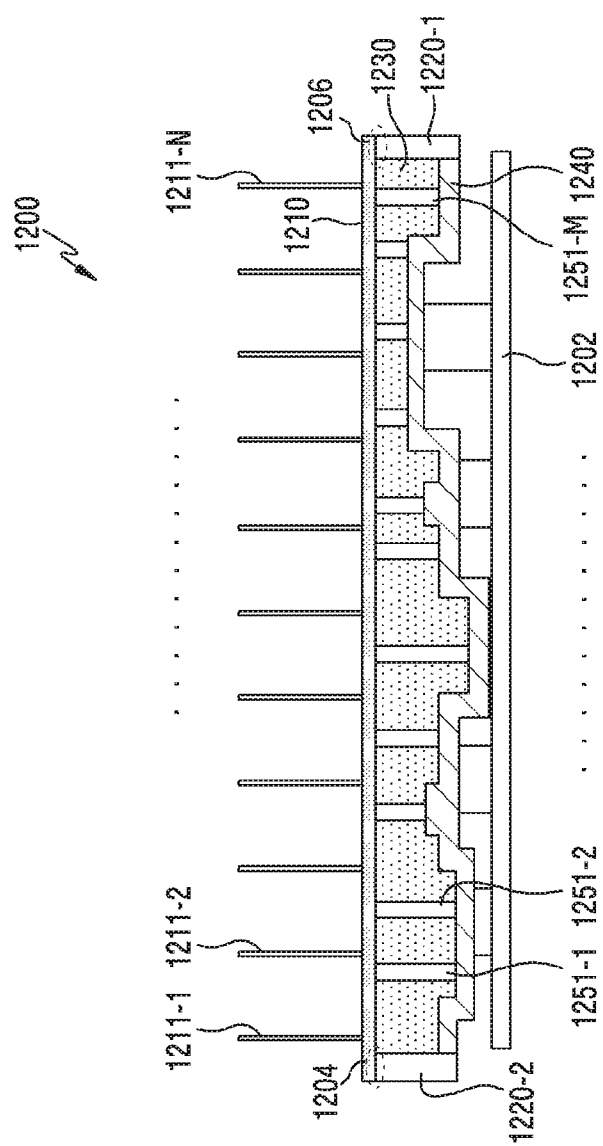
FIG. 12 illustrates the structure of a housing including a boss, according to a first embodiment.

FIG. 12 illustrates a cross-sectional view of a housing 1200 including a boss, according to an embodiment.

Referring to FIG. 12, a bottom has a fin cover 1210 connected with fins 1211-1 to 1211-N, a base 1240 exposed inside, and outer walls 1220 connecting the fin cover 1210 and the base 1240. The outer walls 1220 may have different heights. The fin cover 1210 may be referred to as an upper cover, an upper plate, an upper layer, an upper layer portion, a fin layer, a fin cover, or other terms having the same technical meaning. The base 1240 may be referred to as a lower cover, a lower plate, a lower layer, a base layer, or other terms having the same technical meaning. The outer wall 1220 may be referred to as a side, a side plate, a side layer, or other terms having the same technical meaning. The base 1240 may have a structure of which the z-axial height changes in accordance with the parts included in a PBA disposed in the housing 1200. The fin cover 1210 may have a flat surface.

An internal space 1230 may be defined inside the fin cover 1210, the base 1240, and the outer walls 1220 of the housing 1200. The internal space 1230 is filled with a refrigerant, such as a working fluid having a high heat transfer characteristic. The refrigerant, which is a substance that carries heat while changing the phase, may include a fluid substance or a wick. The fluid included in the refrigerant injected in the space between the fin cover 1210 and the base 1240 may be a common liquid-state substance such as water or acetone. Depending on the use temperature and required conditions of a product, various refrigerants that are used for common heat pipes and vapor chambers may be used. The z-axial thickness of the space 1230 is related to the thermal performance of the injected refrigerant.

According to the structure shown in FIG. 12, heat generated from a PBA transfers to the base 1240 disposed in the housing. The heat transferring inside transfers to the fin cover 1210 by a high-heat conductive refrigerant adjacent to the bottom of the housing and then may be discharged through the fins 1211-1 to 1211-N.

The fin cover 1210 and the base 1240 can be bonded or assembled in various manners in FIG. 12. For example, the fin cover 1210 and the base 1240 can be coupled through the outer walls 1220, can be bonded through friction only on necessary portions by FSW, can be aligned and then are put into a high-temperature high-pressure chamber, whereby bonding surfaces of the fin cover 1210 and the base 1240 can be attached by diffusion welding, or can be bonded by brazing or bolted to each other.

As shown in FIG. 12, the housing 1200 may include one or more bosses 1251-1 to 1251-M connecting the upper fin cover 1210 and the lower base 1240. The number of the bosses 1251-1 to 1251-M may be the same as or different from the number of fins 1211-1 to 1211-N.

In a housing not including a boss, only the portions 1204 and 1206 with which the outer walls 1220 are in contact are bonded to the upper fin cover and the lower base. In the housing 1200 including bosses, a plurality of bosses connecting the upper fin cover and the lower base may be in contact with the upper fin cover 1210 and the lower base 1240. Since the bosses are bonded to the upper fin cover 1210 and the lower base 1240, the upper fin cover 1210 and the lower base 1240 can be more firmly fixed. In this case, the bonding strength that may be insufficient due to the bonding areas 1204 and 1206 only at the portion where the outer walls are positioned can be supplemented.

The bosses shown in FIG. 12 may be formed by die casting in the process of manufacturing the base housing, or may be formed separately from the housing and then bonded to the housing. When diameter of the bosses only has to be 1.0 pi or more, it is possible to freely increase the diameter of the bosses and select the number of the bosses unless the weight is increased.

Figure 13A:
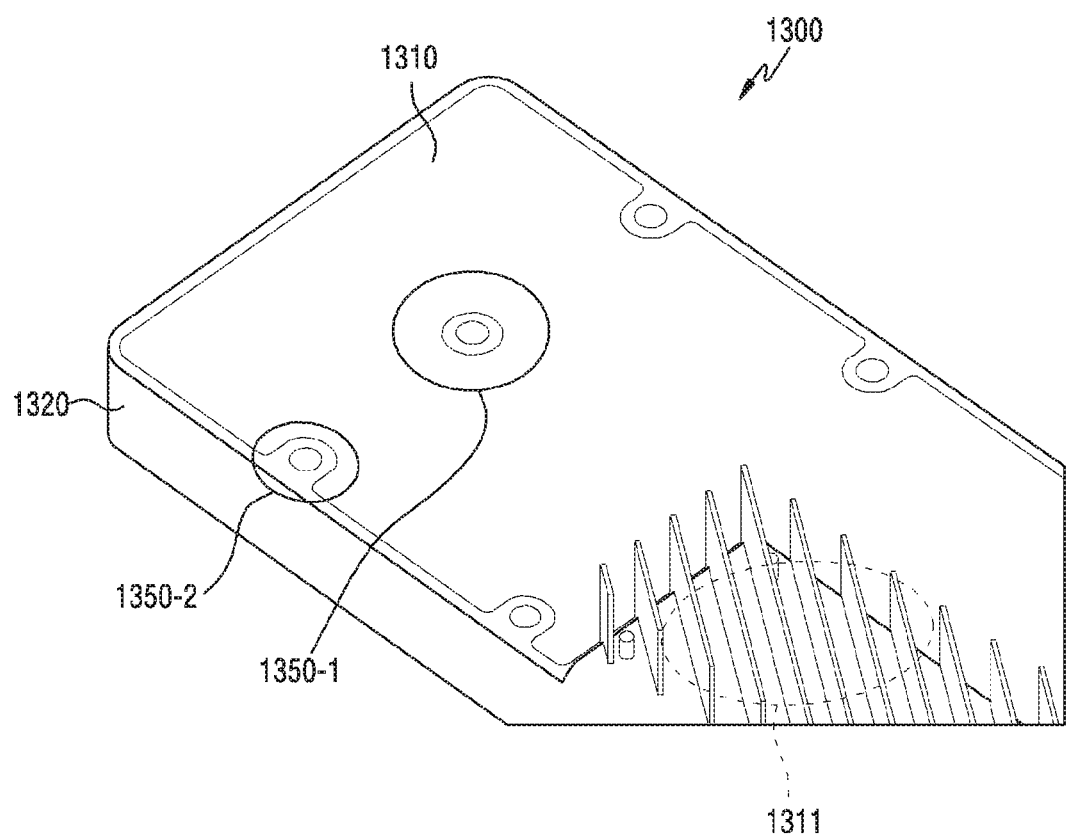
FIG. 13A illustrates the structure of a housing, including a boss, according to a second embodiment.
Figure 13B:
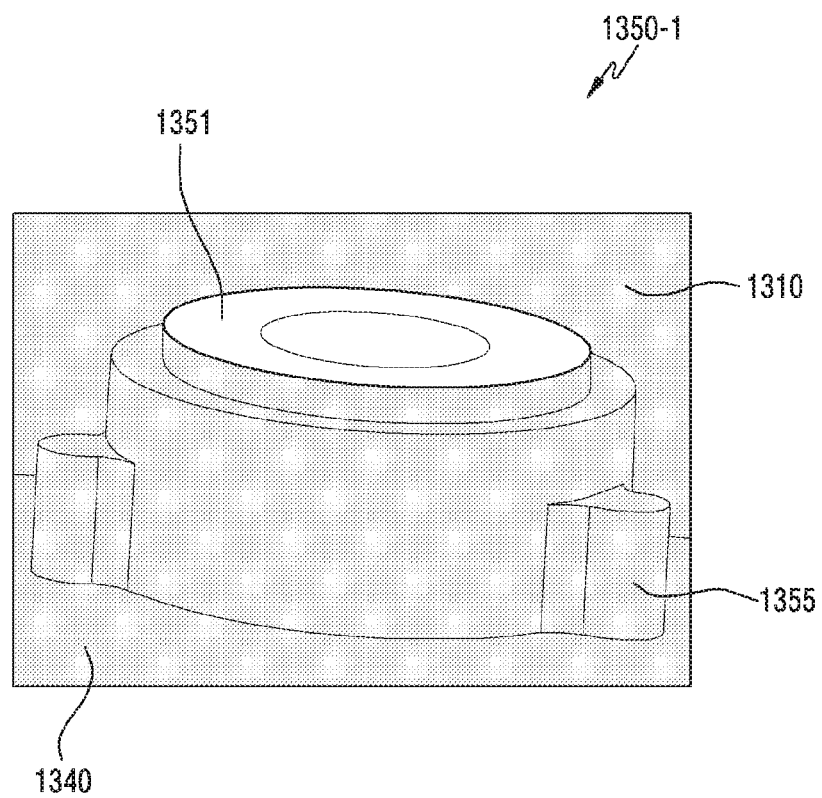
FIG. 13B illustrates the structure of a housing, including a boss, according to a third embodiment.

FIG. 13A illustrates a perspective view of the structure of a housing including a boss, according to an embodiment. FIG. 13B illustrates the structure of a housing including a boss, according to an embodiment. In the housing 1300, an upper fin cover 1310 and a side portion 1320 are bonded to each other. A plurality of fins 1311 may be connected to the upper fin cover 1310. The housing 1300 may have a lower base that is connected to the upper fin cover 1310. The upper fin cover 1310 and the lower base may be connected through an outer wall 1320. As shown in FIGS. 13A and 13B, the upper fin cover 1310 and the lower base may be connected through a boss. The boss may be designed to be in contact with the upper fin cover 1310 and the lower base in the internal space of the housing.

When FSW is applied to the manufacturing process of a housing including bosses, a fin cover and a base should be bonded such that bosses do not overlap together with a space in which a tool can be rotated. In the manufacturing process of a housing including bosses, an area that can resist the weight of a tool at the lower portion should be considered in designing. A bonding portion may be determined at several positions in a product, depending on the size of the housing. Reference numeral 1350-1 indicates a portion where a boss connecting the upper fin cover 1310 and the lower base is bonded to the upper fin cover 1310. Reference numeral 1350-2 indicates a portion where a boss being in contact with the upper fin cover 1310, the lower base, and the outer wall 1320 is bonded to the upper fin cover 1310. The position and the number of bosses is not limited to those shown in FIG. 13. The number of bosses may be greater than or less than those shown in FIGS. 13A and 13B.

FIG. 13B is an enlarged view of a portion 1350-1 where the lower base, the fin cover 1310, and the boss of the housing 1300 are bonded. As shown in FIG. 13B, reference numeral 1351 indicates a portion not covered with the upper fin cover 1310 in the housing 1300, that is, the top surface of the boss.

Figure 13C:
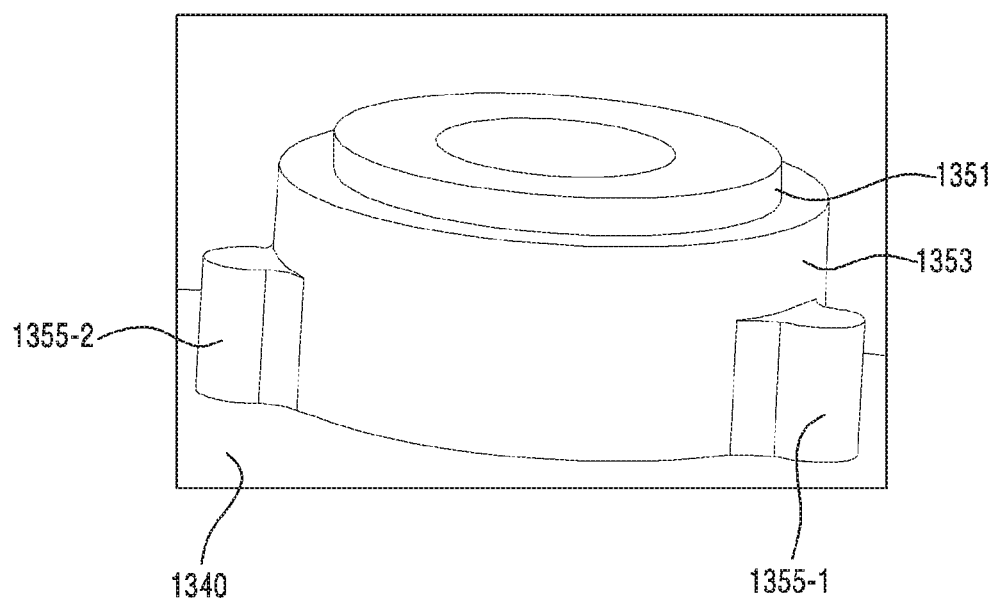
FIG. 13C illustrates the structure of a housing, including a boss, according to a third embodiment.

FIG. 13C shows a boss to which the upper fin cover 1310 is not bonded, and shows the shape of a boss bonded to the lower base. As shown in FIG. 13C, the boss may have a body 1353, a protrusion 1351, and fixing portions 1355-1, 1355-2. The diameter of the body 1353 may be smaller than the diameter of the protrusion 1351. Though not shown in the figure, the difference of diameter between the body 1353 and the protrusion 1351 may depend on embodiments. The fixing portions 1355-1, 1355-2 can fix the lower base 1340 and the body 1353. Though not shown in the figure, a plurality of fixing portions 1355 may be bonded to one body 1353.

FSW and brazing may be applied to the housings 1200 and 1300 including a housing, similar to the bonding area of a housing not including a boss. However, according to FSW, a specific tool rotating while strongly pressing a fin cover and bonding is performed by melting the material with a friction heat, so bonding may be difficult when a fin cover is thick. In FSW, a tool should be applied to all bonding portions, so it is difficult to design many bosses to have many bonding portions. However, brazing has the advantage that when a product is put into a high-temperature furnace in a bonded state, several portions are simultaneously bonded. However, there is a problem that an aluminum material for extrusion that is used for manufacturing a fin cover or a die-casting material that is used for a base are difficult to use in brazing.

Figure 14A:
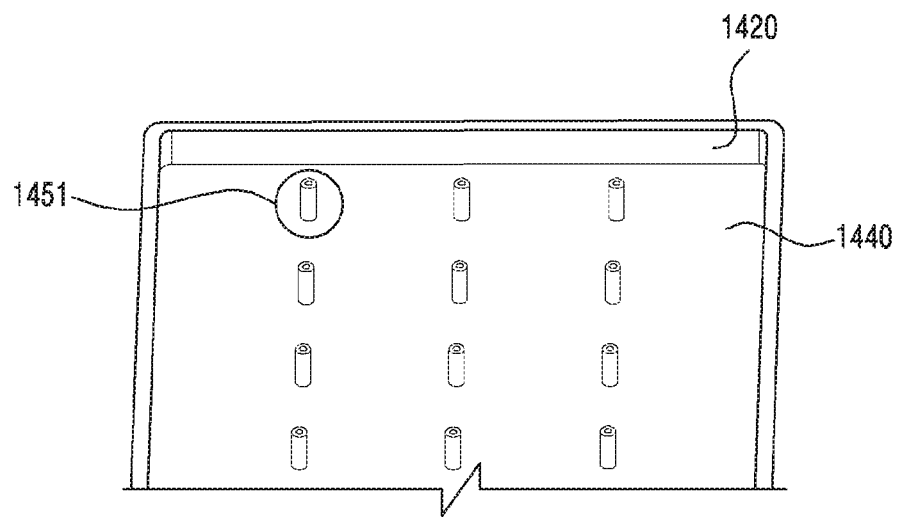
FIG. 14A illustrates the shapes of a lower base and a boss, according to an embodiment.
Figure 14B:
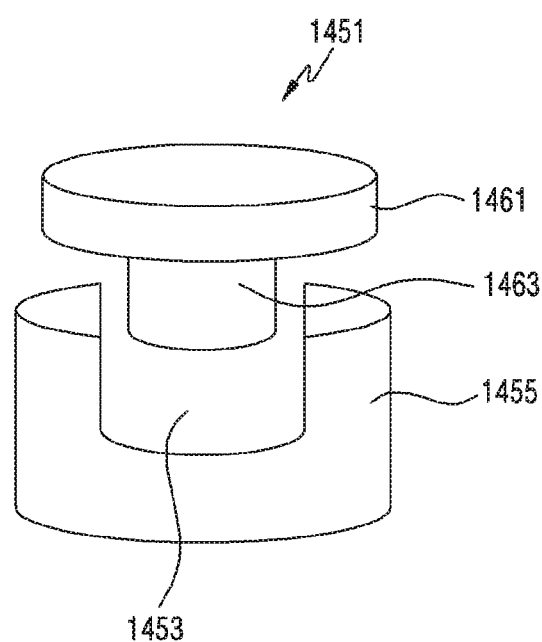
FIG. 14B is an enlarged view of the boss illustrated in FIG. 14A.

FIGS. 14A and 14B examples of the shapes of a lower base and a boss, according to an embodiment.

In FIGS. 14A and 14B, a lower base 1440 and a plurality of bosses 1451-1 to 1451-N are bonded before an upper fin cover is bonded in a housing apparatus. Reference numeral 1440 indicates a lower base of the housing. Reference numeral 1420 indicates an outer wall coupled to the lower base 1440 and an upper fin cover not shown in the figure. Reference numeral 1451 indicates a boss connecting the upper fin cover and the lower base. The structure shown in FIGS. 14A and 14B is an embodiment, and the positions and number of bosses may depend on housing apparatuses. Similar to the boss indicated by 1350-2 in FIG. 13A, the boss may be bonded to the lower base 1440, the upper fin cover, and the outer wall 1420.

FIG. 14B is an enlarged view of the boss 1451 shown in FIG. 14A. Referring to FIG. 14B, the boss may have a body 1455 and a groove 1453 having predetermined width and depth at the end of the boss. A separate filler material or a double-sided clad for brazing may be inserted in the groove 1453 of the boss. The filler material may have a melting point lower than the material of the boss. The filler material or the double-sided clad may have a protrusion 1463 that is inserted in the groove, and a body 1461 exposed over the upper fin cover layer. The depth or the cross-sectional shape of the groove 1453 of the boss may vary. For example, the groove may have a circular shape. The shape of the boss may be determined by die casting. The boss may have a groove having predetermined width and depth at the end. The filler material or the double-sided clad may be applied not only to a boss, but also a portion that needs to be bonded to seal a refrigerant such as the edge of a product.

Figure 15A:
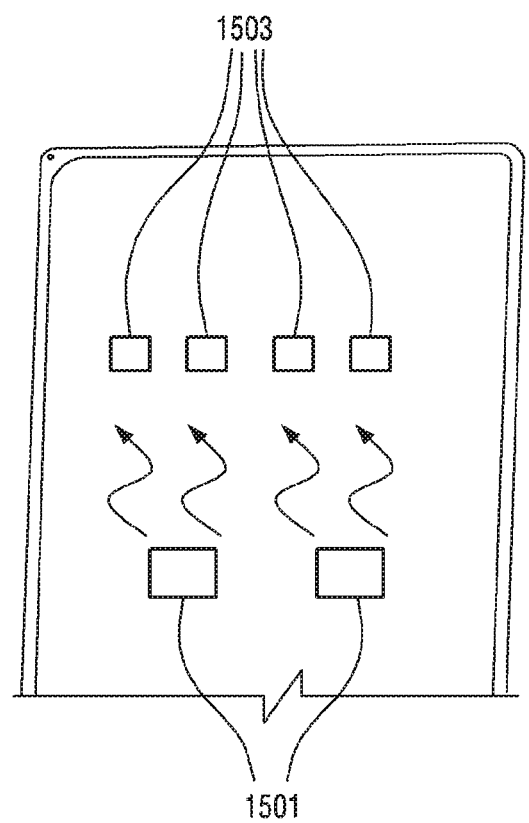
FIG. 15A illustrates the flow of heat in a lower base to which a boss having a linear structure is not bonded, according to an embodiment.

FIG. 15A illustrates the flow of heat in a lower base to which a boss having a linear structure is not bonded, according to an embodiment. The portion indicated by reference numeral 1501 is the upper end of a product and the portion indicated by reference numeral 1503 is the lower end of a housing product. As shown in FIG. 15A, heat generated from a product lower end 1501 spreads and influences the product upper end 1503.

Figure 15B:
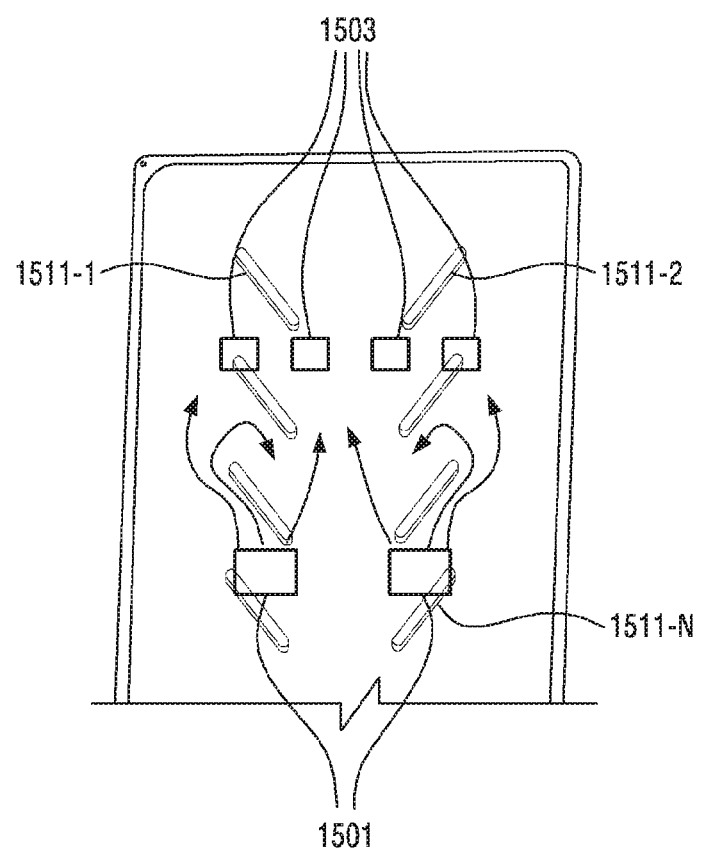
FIG. 15B illustrates a structure in which a boss having a linear structure is bonded to a lower base, according to an embodiment.

FIG. 15B illustrates a structure in which a boss having a linear structure is bonded to a lower base, according to an embodiment. As shown in FIG. 15B, a lower base may be bonded to a plurality of bosses 1511-1 to 1511-N having a linear structure. The positions, numbers, and direction of the bosses may depend on housing apparatuses. The bonding area of an upper fin cover and a lower base can be increased by the bosses 1511-1 to 1511-N having a linear structure. As the bonding area increases, higher bonding strength can be secured. It is also possible to adjust the flow of heat generated inside in accordance with the positions and the shapes of bosses. As shown in FIG. 15B, heat spreads along the linear bosses, thereby preventing local concentration of heat or stagnation of spreading heat. It is possible to achieve an effect that prevents thermal interference between heat transferring from different regions of a PBA bonded to the lower base and to prevent influence to the upper end by a heat source at the lower end by adjusting the positions of the linear bosses. The positions, widths, thicknesses, and angles of the bosses may depend on the flow of heat.

Figure 16A:
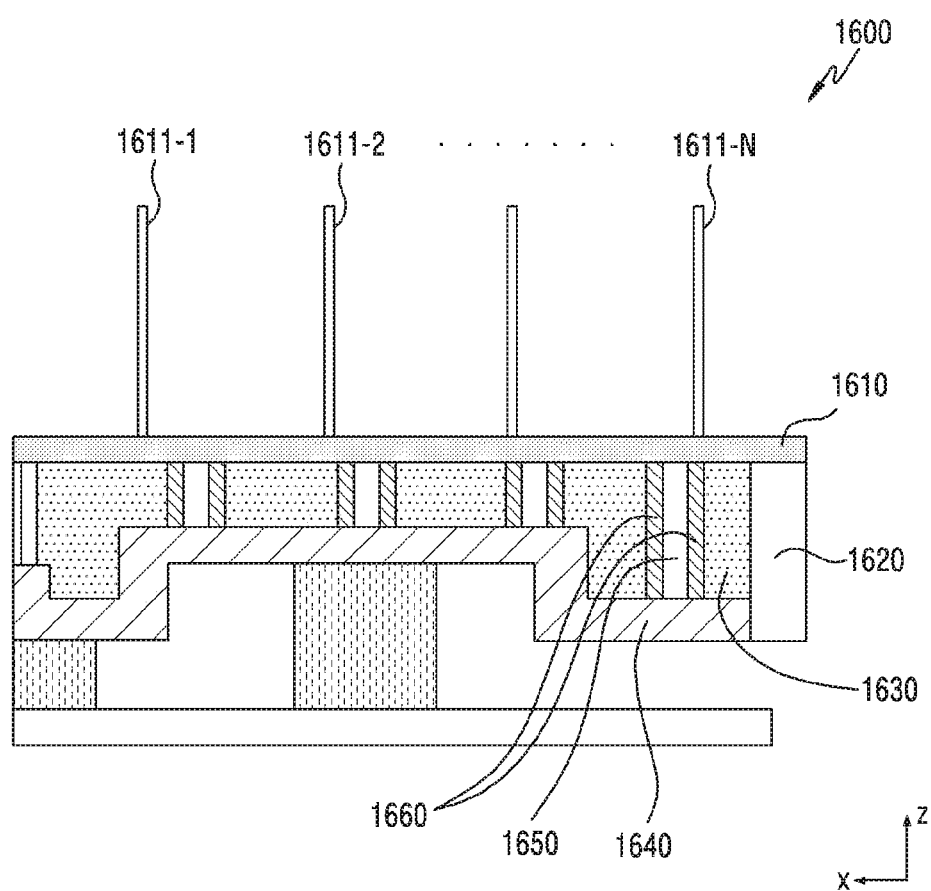
FIG. 16A illustrates the structure of a housing including a boss, according to a first embodiment.

FIG. 16A illustrates the structure of a housing including a boss, according to an embodiment.

As shown in FIG. 16A, a housing 1600 has a fin cover 1600 connected with fins 1611-1 to 1610-N, a lower base 1640 exposed inside, and outer walls 1620 connecting the fin cover 1610 and the base 1640. The outer walls 1620 may have different heights. The fin cover 1610 may be referred to as an upper cover, an upper plate, an upper layer, an upper layer portion, a fin layer, a fin cover, or other terms having the same technical meaning. The base 1640 may be referred to as a lower cover, a lower plate, a lower layer, a base layer, or other terms having the same technical meaning. The outer wall 1620 may be referred to as a side portion, a side plate, a side layer, or other terms having the same technical meaning. The base 1640 may have a structure of which the z-axial height changes in accordance with the parts included in a PBA disposed in the housing 1600. The fin cover 1610 may have a flat surface.

An internal space 1630 may be defined inside the fin cover 1610, the base 1640, and the outer walls 1620 of the housing 1600. The internal space 1630 is filled with a refrigerant, such as a working fluid having a high heat transfer characteristic. The refrigerant, which is a substance that carries heat while changing the phase, may include a fluid substance or a wick. The fluid included in the refrigerant injected in the space between the fin cover 1610 and the base 1640 may be a common liquid-state substance such as water or acetone. Depending on the use temperature and required conditions of a product, various refrigerants that are used for common heat pipes and vapor chambers may be used. The z-axial thickness of the space 1630 is related to the thermal performance of the injected refrigerant.

Figure 16B:
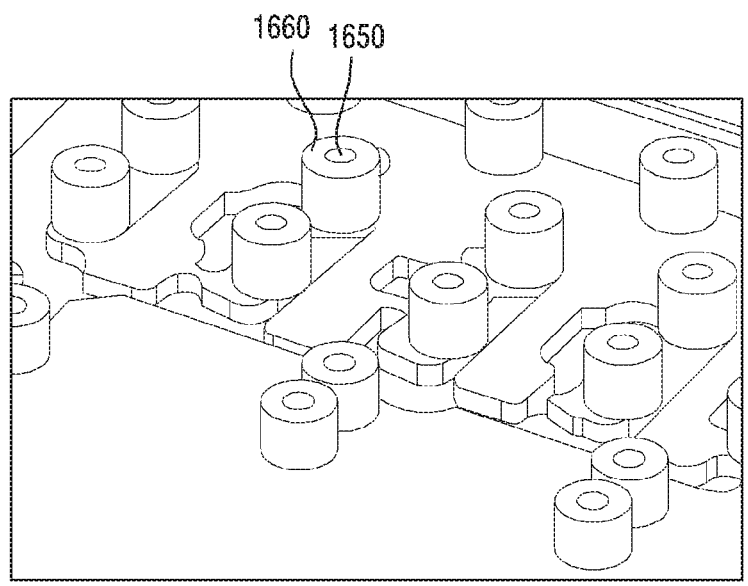
FIG. 16B is a perspective view of the housing shown in FIG. 16A.

As shown in FIGS. 16A and 16B, heat generated from the PBA transfers to the base 1640 disposed in the housing, the heat transferring inside transfers to the fin cover 1610 by the high-heat conductive refrigerant adjacent to the bottom of the housing, and then the heat can be discharged through the fins 1611-1 to 1611-N.

The fin cover 1610 and the base 1640 can be bonded or assembled in various manners in FIGS. 16A and 16B. For example, the fin cover 1610 and the base 1640 can be coupled through the outer walls 1620, can be bonded through friction only on necessary portions by FSW, can be aligned and then are put into a high-temperature high-pressure chamber, whereby bonding surfaces of the fin cover 1610 and the base 1640 can be attached by diffusion welding, or can be bonded by brazing or bolted to each other. As shown in FIGS. 16A and 16B, the housing 1600 may include bosses 1650 connecting the upper fin cover 1610 and the lower base 1640.

In a housing not including a boss, only the portions 1640 and 1660 with which the outer walls 1620 are in contact are bonded to the fin cover at the upper portion and the base at the lower portion. In the housing 1600 including bosses, a plurality of bosses connecting the fin cover at the upper portion and the base at the lower portion may be in contact with the upper fin cover 1610 and the lower base 1640. Since the bosses are bonded to the upper fin cover 1610 and the lower base 1640, the upper fin cover 1610 and the lower base 1640 can be more firmly fixed. In this case, the bonding strength that may be insufficient due to the bonding areas 1640 and 1660 only at the portion where the outer walls are positioned can be supplemented.

The bosses shown in FIGS. 16A and 16B may be formed by die casting in the process of manufacturing the base housing. As another example, the bosses of the housing 1600 may be formed separately from the housing and then bonded to the housing, whereby the housing 1600 can be achieved. When diameter of the bosses has only to be 1.0 pi or more, and it is possible to freely increase the diameter of the bosses and select the number of the bosses unless the weight is increased.

In a housing including a flat fin cover and bosses, the thickness may not be uniform, depending on regions. The thickness of a closed space in which a refrigerant circulates increases, depending on the length of bosses, so heat of a heat generation part may have difficulty in transferring to the fin cover. In order the cure this problem, a structure 1660 made of high-heat conductive metal and having the same diameter as the bosses at 1:1 may be bonded to the bosses to surround the bosses. The high-heat conductivity metal 1660 may be metal materials such as copper, silver, and gold, or a carbon sheet. The bosses may be made of an aluminum material. According to this structure, the heat dissipation effect in the thickness direction (z-axial direction) can be improved.

FIG. 16B is a perspective view of the housing shown in FIG. 16A. As shown in FIG. 16B, a housing composed of a boss and high-heat conductivity metal surrounding the boss may be bonded to the housing, and the numbers and positions of the boss and the structure 1660 made of high-heat conductive metal and surrounding the boss may vary depending on the products.

Figure 17:
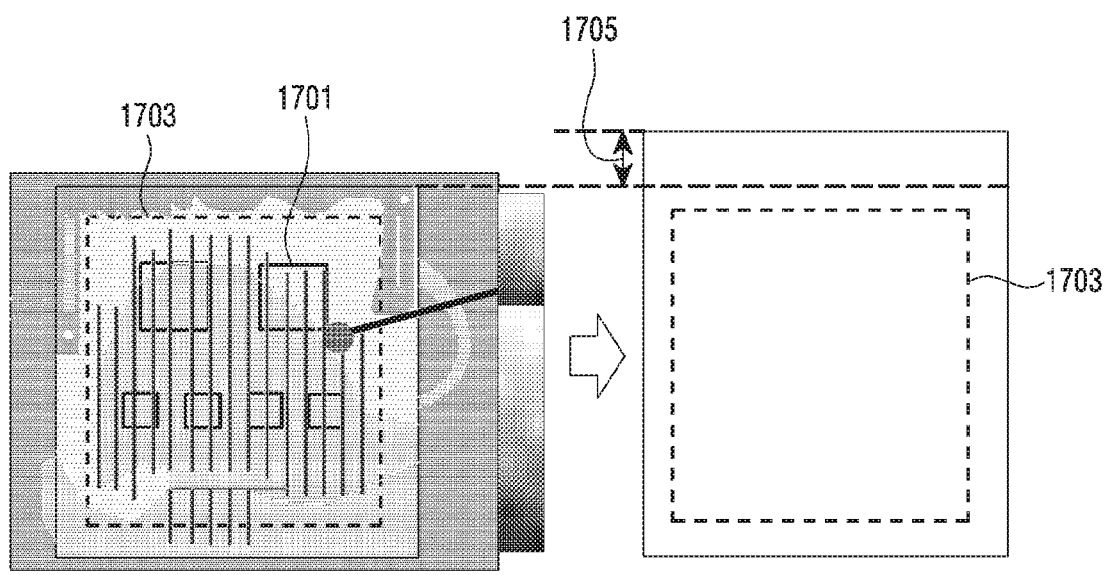
FIG. 17 illustrates a housing having a separate space at the upper end of the housing, according to an embodiment.

FIG. 17 illustrates a housing having a separate space at the upper end of the housing, according to an embodiment.

When a refrigerant is injected into the bottom of a mechanical housing, heat spreads throughout the bottom. A vaporized refrigerant heated by heat rises against gravity, and accordingly, heat is concentrated in the upper portion in the images of the figure. Reference numeral 1701 indicated by a solid line indicates the position of heat generation sources in the housing. Reference numeral 1703 indicated by a dotted line indicates the position of a PBA having heat generation parts.

As shown in FIG. 17, heat may spread around from the heat generation sources. In this case, the parts mounted on the PBA close to the upper portion in which heat is concentrated by heat spread may be thermally damaged.

The housing shown in FIG. 17 may have a specific space 1705 so that heat can be concentrated at the upper portion of the product without influencing the PBA. The temperature of all parts in the housing may decrease, so the height of fins can be reduced and the weight can be decreased.

Figure 18A:
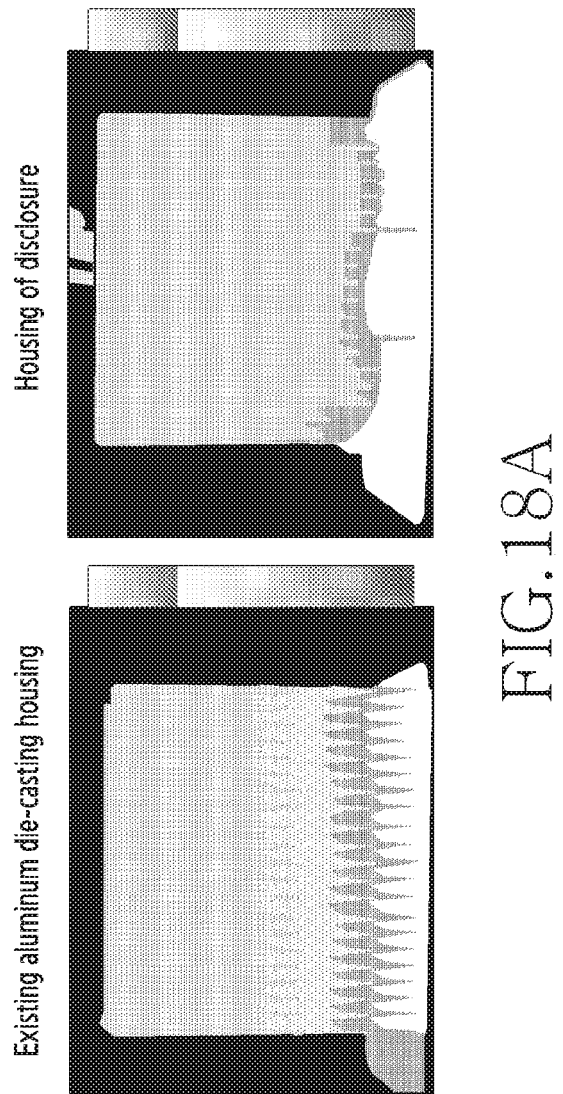
FIG. 18A illustrates a heat dissipation performance of a housing, according to a first embodiment.

FIG. 18A illustrates a heat dissipation performance of a housing of a device, according to a first embodiment FIG. 18A is the result of taking a picture of the degree of heat transfer with an infrared thermal camera after the end portion of a housing is placed into hot water. As for the existing aluminum housing on the left side, it can be seen that the portion sunk in the hot water is higher than the housing disclosed in FIG. 18A on the right side, and heat does not transfer well as it rises to the upper portion of the product. On the other hand, the product according to an embodiment on the right side exhibits a greater transfer of heat.

Figure 18B:
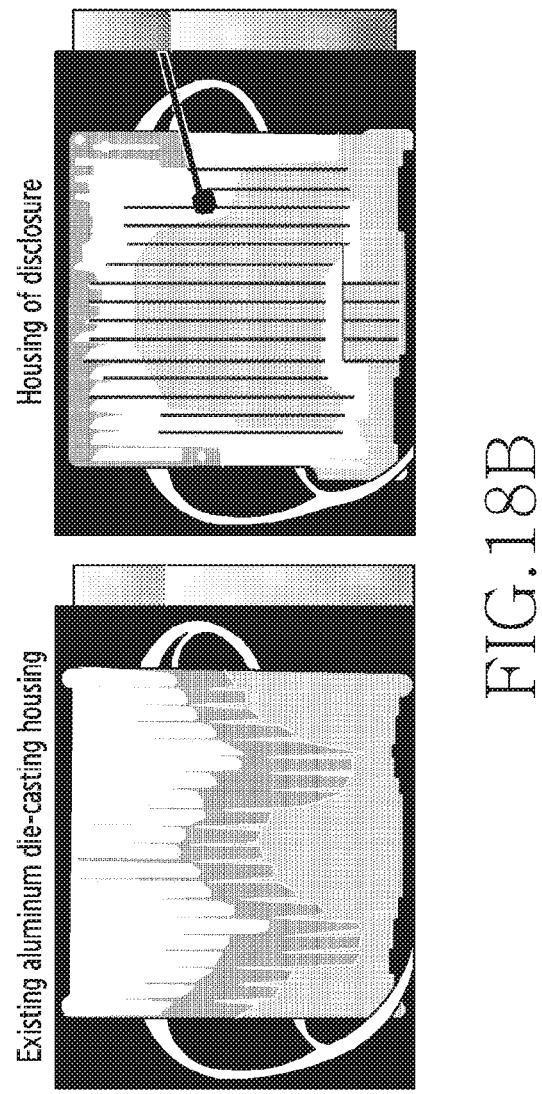
FIG. 18B illustrates the heat dissipation performance of the housing, according to a second embodiment.

FIG. 18B illustrates the heat dissipation performance of the housing of a device, according to a second embodiment. FIG. 18B is the result of taking a picture of the degree of heat transfer with an infrared thermal camera after a heat source is disposed in a housing. As for the existing die-casting product on the left side, a hot spot exists around a heat source. On the other hand, the product according to an embodiment on the right side exhibits more efficient heat transfer from the heat source and concentrated at the edge of the product.

Methods disclosed in the claims and/or methods according to embodiments described herein may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to embodiments of the disclosure.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. A plurality of such memories may be included in the electronic device.

In addition, the programs may be stored in an attachable storage device which may access the electronic device through communication networks such as the Internet, Intranet, local area network (LAN), wide LAN (WLAN), and storage area network (SAN) or a combination thereof. Such a storage device may access the electronic device via an external port. A separate storage device on the communication network may access a portable electronic device.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An apparatus with a housing, the apparatus comprising:
    the housing including a fin cover, a base, outer walls perpendicular to the base, and a plurality of fins; and
    an operating circuit disposed in the housing,
    wherein the fin cover comprises:
        a flat surface connected to the plurality of fins, and
        a plurality of through slots,
    wherein the base comprises at least one surface corresponding to the housing,
    wherein the outer walls comprise a first outer wall and a second outer wall connecting between the fin cover and the base,
    wherein a refrigerant is filled in a space formed by the outer walls, the fin cover, and the base,
    wherein a height of the first outer wall is lower than a height of the second outer wall disposed closer to the operating circuit than the first outer wall,
    wherein the operating circuit is disposed on a part of the base, which is adjacent to the second outer wall,
    wherein each of the plurality of fins includes a first portion perpendicularly protruded to the fin cover and a second portion perpendicular to the first portion,
    wherein a width of the second portion is larger than a width of the first portion,
    wherein the plurality of fins are inserted into the plurality of through slots, respectively such that the second portion of each of the plurality of fins is disposed between the fin cover and the base, and wherein the second portion disposed between the fin cover and the base is coupled to the fin cover such that the plurality of fins are fixed to the fin cover.

2. The apparatus of claim 1,
wherein the first portion and the second portion of each of the plurality of fins form an L-shape structure.

3. The apparatus of claim 1, further comprising a plurality of bosses connected to the fin cover and the base.

4. The apparatus of claim 3,
wherein each of the plurality of bosses has a groove having a predetermined width and depth.

5. The apparatus of claim 4,
wherein the plurality of bosses are bonded to the fin cover by brazing.

6. The apparatus of claim 3,
wherein the plurality of bosses have a linear structure.

7. The apparatus of claim 3, further comprising a heat conducting metal surrounding the plurality of bosses.

8. The apparatus of claim 1, further comprising a separate space at an upper end of the housing.

9. The apparatus of claim 1,
wherein the at least one surface of the base has a shape corresponding to heights of parts included in the operating circuit.

10. The apparatus of claim 1,
wherein the base includes at least one protrusion protruding toward the space to install a fastener configured to fix the operating circuit to the housing.

11. The apparatus of claim 1,
wherein the fin cover includes at least one protrusion protruding toward the space to install a fastener configured to fix the operating circuit to the housing, and
wherein the base includes at least one hole in which the at least one protrusion is inserted.

12. The apparatus of claim 1,
wherein the housing further includes a partition configured to separate the space into a plurality of sections.

13. The apparatus of claim 12,
wherein the partition is formed by extending at least one protrusion protruding toward the space from the base to install a fastener configured to fix the operating circuit to the housing.

14. The apparatus of claim 12,
wherein a first section and a second section are defined by the partition.

15. The apparatus of claim 1,
wherein the plurality of fins are filled with a refrigerant.

16. The apparatus of claim 1,
wherein the housing is able to be tilted with respect to the base with the second outer wall as a bottom.

17. A housing of an apparatus, the housing comprising:
a fin cover;
a base comprising at least one surface;
outer walls comprising a first outer wall and a second outer wall connected to between the fin cover and the base; and
a plurality of fins connected to the fin cover, wherein the fin cover comprises a flat surface and a plurality of through slots,
wherein the outer walls are perpendicular to the base,
wherein the at least one surface of the base corresponds to a structure in which an operating circuit is disposed;
wherein a refrigerant is filled in a space between the fin cover and the base,
wherein a height of the first outer wall is lower than a height of the second outer wall disposed closer to the operating circuit than the first outer wall,
wherein the operating circuit is disposed on a part of the base, which is adjacent to the second outer wall,
wherein each of the plurality of fins includes a first portion perpendicularly protruded to the fin cover and a second portion perpendicular to the first portion,
wherein a width of the second portion is larger than a width of the first portion,
wherein the plurality of fins are inserted into the plurality of through slots, respectively such that the second portion of each of the plurality of fins is disposed between the fin cover and the base, and
wherein the second portion disposed between the fin cover and the base is coupled to the fin cover such that the plurality of fins are fixed to the fin cover.

18. The housing of claim 17,
wherein the first portion and the second portion of each of the plurality of fins form an L shape structure.

19. The housing of claim 17, further comprising a plurality of bosses connected to the fin cover and the base.

* * * * *